(12) United States Patent
Lee

(10) Patent No.: US 11,950,453 B2
(45) Date of Patent: Apr. 2, 2024

(54) DISPLAY DEVICE AND METHOD OF MANUFACTURING THE SAME

(71) Applicant: SAMSUNG DISPLAY CO., LTD., Yongin-si (KR)

(72) Inventor: Sangwon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/112,072

(22) Filed: Feb. 21, 2023

(65) Prior Publication Data
US 2023/0284479 A1 Sep. 7, 2023

(30) Foreign Application Priority Data

Mar. 7, 2022 (KR) ........................ 10-2022-0028934

(51) Int. Cl.
| | | |
|---|---|---|
| *H10K 59/12* | (2023.01) | |
| *B32B 3/26* | (2006.01) | |
| *B32B 15/18* | (2006.01) | |
| *H01L 25/16* | (2023.01) | |
| *B32B 7/12* | (2006.01) | |
| *B32B 15/04* | (2006.01) | |
| *B32B 17/06* | (2006.01) | |
| *B32B 27/28* | (2006.01) | |

(52) U.S. Cl.
CPC ......... *H10K 59/1201* (2023.02); *B32B 3/266* (2013.01); *B32B 15/18* (2013.01); *H01L 25/167* (2013.01); *B32B 7/12* (2013.01); *B32B 15/043* (2013.01); *B32B 17/06* (2013.01); *B32B 27/281* (2013.01); *B32B 2260/02* (2013.01); *B32B 2260/046* (2013.01); *B32B 2307/208* (2013.01); *B32B 2307/412* (2013.01); *B32B 2457/20* (2013.01)

(58) Field of Classification Search
None
See application file for complete search history.

(56) References Cited

U.S. PATENT DOCUMENTS

| | | | | |
|---|---|---|---|---|
| 7,161,090 | B2 * | 1/2007 | Mattsson | H05K 3/284 |
| | | | | 174/353 |
| 10,899,065 | B2 | 1/2021 | Seo et al. | |
| 11,289,686 | B2 | 3/2022 | Jung et al. | |
| 2014/0368555 | A1 * | 12/2014 | Namkung | H10K 50/82 |
| | | | | 257/40 |
| 2015/0146387 | A1 * | 5/2015 | Lee | G06F 1/1652 |
| | | | | 361/749 |
| 2017/0153732 | A1 * | 6/2017 | Choi | G02B 5/3025 |
| 2019/0179182 | A1 * | 6/2019 | Zuo | G06F 3/041 |

FOREIGN PATENT DOCUMENTS

| | | | | |
|---|---|---|---|---|
| CN | 111341217 A | * | 6/2020 | ........... G06F 3/0412 |
| KR | 101588600 B1 | | 2/2016 | |
| KR | 1020170048654 A | | 5/2017 | |
| KR | 20190081968 A | | 7/2019 | |
| KR | 1020190130105 A | | 11/2019 | |
| KR | 20220021562 A | * | 2/2022 | |

* cited by examiner

*Primary Examiner* — Seth Dumbris
(74) *Attorney, Agent, or Firm* — CANTOR COLBURN LLP

(57) ABSTRACT

A display device includes a ferromagnetic layer including a ferromagnetic material, a cover window disposed above the ferromagnetic layer, and a display panel disposed between the ferromagnetic layer and the cover window, where the display panel includes a curved area which is bent.

9 Claims, 31 Drawing Sheets

DISPLAY DEVICE AND METHOD OF MANUFACTURING THE SAME

This application claims priority to Korean Patent Application No. 10-2022-0028934, filed on Mar. 7, 2022, and all the benefits accruing therefrom under 35 U.S.C. § 119, the content of which in its entirety is herein incorporated by reference.

BACKGROUND

1. Field

One or more embodiments relate to a display device and a method of manufacturing the display device.

2. Description of the Related Art

Mobile electronic devices have been widely used in various fields. In addition to small electronic devices, such as mobile phones, tablet personal computers (PCs) have recently been widely used as mobile electronic devices.

Such a mobile electronic device includes a display device for providing a user with visual information, such as an image or video to support various functions. Recently, as other parts for driving the display device have become smaller, a proportion of the display device in an electronic device has been gradually increasing, and a structure capable of being bent from a flat state to have a certain angle has also been developed.

SUMMARY

One or more embodiments include a display device bent from a flat state to have a certain angle and a method of manufacturing the display device.

According to one or more embodiments, a display device includes a ferromagnetic layer including a ferromagnetic material, a cover window disposed above the ferromagnetic layer, and a display panel disposed between the ferromagnetic layer and the cover window, where the display panel includes a curved area which is bent.

In an embodiment, the ferromagnetic material may include at least one selected from iron, nickel, and cobalt.

In an embodiment, the display device may further include an anti-magnetization layer disposed between the display panel and the ferromagnetic layer.

In an embodiment, the display panel may further include a flat area which is planar, where the curved area may extend from the flat area, where the curved area may include a first adjacent area adjacent to the flat area in a first direction, a second adjacent area adjacent to the flat area in a second direction crossing the first direction, and a corner area at least partially surrounding the first adjacent area, the flat area, and the second adjacent area, and where the first adjacent area, the second adjacent area, and the corner area may be bent.

In an embodiment, the corner area may include a plurality of extension areas extending in a direction away from the flat area, where a space area may be defined between adjacent extension areas from among the plurality of extension areas.

In an embodiment, a ferromagnetic layer opening may be defined through the ferromagnetic layer to overlap the flat area.

In an embodiment, a plurality of panel openings may be defined through the display panel to be apart from each other.

In an embodiment, a plurality of ferromagnetic layer openings may be defined through the ferromagnetic layer to be apart from each other, where the plurality of panel openings and the plurality of ferromagnetic layer openings may respectively overlap each other.

In an embodiment, the ferromagnetic layer may include a first area including a conductive material and a second area at least partially surrounding the first area and including the ferromagnetic material.

In an embodiment, the ferromagnetic layer may include an elastomer.

According to one or more embodiments, a method of manufacturing a display device includes preparing a display substrate including a display panel and a ferromagnetic layer, where the ferromagnetic layer includes a ferromagnetic material, disposing the display substrate over a shape transformation device including an electromagnet, and bending the display substrate, where the bending the display substrate includes applying a current to the electromagnet.

In an embodiment, the method may further include disposing a cover window on the display substrate after the bending the display substrate.

In an embodiment, the display panel may include a flat area which is planar and a curved area that extends from the flat area and is bent, where the curved area may include a first adjacent area adjacent to the flat area in a first direction, a second adjacent area adjacent to the flat area in a second direction crossing the first direction, and a corner area at least partially surrounding the first adjacent area, the flat area, and the second adjacent area, where the bending the display substrate may further include bending the first adjacent area, the corner area, and the second adjacent area.

In an embodiment, the method may further include disposing the display substrate on a guide film, where the guide film may include a guide central area, a guide outer area extending from the guide central area, a first guide extension area extending from the guide outer area in the first direction, and a second guide extension area extending from the guide outer area in the second direction, where the display substrate may be arranged in the guide central area and the guide outer area.

In an embodiment, the bending the display substrate may further include applying a tensile force to the first guide extension area and the second guide extension area.

In an embodiment, the corner area may include a plurality of extension areas extending in a direction away from the flat area, where a space area may be defined between adjacent extension areas from among the plurality of extension areas.

In an embodiment, the preparing the display substrate may include providing the ferromagnetic layer under the display panel.

In an embodiment, the ferromagnetic layer may be provided by one of a deposition process, a coating process, and a lamination process.

In an embodiment, the ferromagnetic material may include at least one selected from iron, nickel, and cobalt.

In an embodiment, the shape transformation device may further include a pad on which the display substrate is seated, and a support disposed under the pad and at which the electromagnet is installed.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1A:
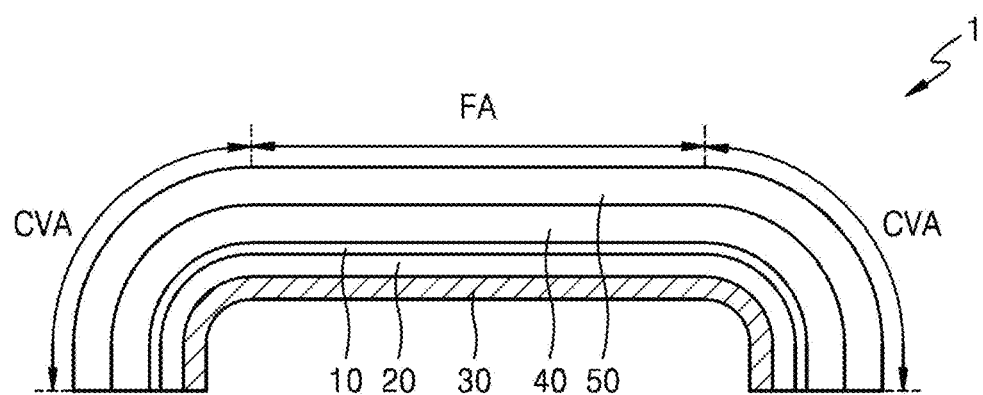
FIGS. 1A and 1B are each a schematic cross-sectional view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. Hereinafter, features of embodiments of the disclosure and a method for accomplishing them will be described more fully with reference to the accompanying drawings, in which embodiments of the disclosure are shown. The disclosure may, however, be embodied in many different forms and should not be construed as limited to the embodiments set forth herein.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Sizes of elements in the drawings may be exaggerated or reduced for convenience of explanation. For example, since sizes and thicknesses of elements in the drawings are arbitrarily illustrated for convenience of explanation, the following embodiments are not limited thereto.

When an embodiment may be implemented differently, a certain process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or may be indirectly connected to each other with intervening layers, regions, or elements therebetween. For example, when layers, regions, or elements are referred to as being electrically connected to each other, they may be directly electrically connected to each other or may be indirectly electrically connected to each other with intervening layers, regions, or elements therebetween.

A display device is a device displaying a moving image or a still image, and may be used as the display screen of not only portable electronic devices, such as a mobile phone, a smartphone, a tablet personal computer (PC), a mobile communication terminal, an electronic notebook, an e-book, a portable multimedia player (PMP), a navigation system, and an ultra-mobile PC (UMPC), but also various products, such as a television, a laptop, a monitor, a billboard, and the Internet of things (IoT). In addition, a display device according to an embodiment may be used in wearable devices, such as a smartwatch, a watch phone, a glasses-type display, and a head-mounted display (HMD). In addition, a display device according to an embodiment may be used as a car's instrument panel, a center information display (CID) placed on a car's center fascia or dashboard, a room mirror display replacing a car's side mirror, or a display placed on the back of a front seat as entertainment for a car's rear seat.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below, Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
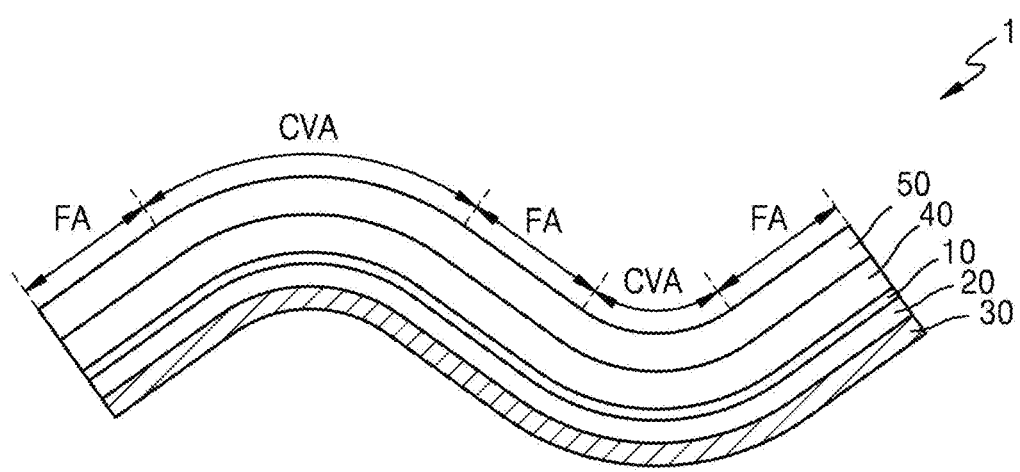

FIGS. 1A and 1B are each a schematic cross-sectional view of a display device 1 according to an embodiment.

Referring to FIGS. 1A and 1B, an embodiment of the display device 1 may include a display panel 10, a cover panel 20, a ferromagnetic layer 30, an adhesive layer 40, and a cover window 50. The display panel 10 may display an image. In an embodiment, the display panel 10 may include a substrate, a circuit layer, and a light-emitting element layer. The substrate may include polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, etc. In an embodiment, the substrate may have a multi-layer structure including a base layer and a barrier layer (not shown), the base layer including the above-described polymer resin. The substrate including polymer resin may be flexible, rollable and/or bendable. In some embodiments, the substrate may include glass.

The circuit layer may be disposed on the substrate. The circuit layer may include a transistor and a storage capacitor. The light-emitting element layer may be disposed on the circuit layer. The light-emitting element layer may include a light-emitting element. The light-emitting element may be an organic light-emitting diode including an organic emission layer. Alternatively, the light-emitting element may be a light-emitting diode (LED) including an inorganic emission layer. The size of the LED may be in a micro scale or a nano scale. In an embodiment, for example, the LED may be a micro LED. Alternatively, the LED may be a nanorod LED. The nanorod LED may include gallium nitride (GaN). In an embodiment, a color conversion layer may be disposed on the nanorod LED. The color conversion layer may include quantum dots. Alternatively, the light-emitting element may be a quantum dot LED including a quantum dot emission layer.

The display panel 10 may include a curved area CVA. The curved area CVA may be a bent area of the display panel 10. In an embodiment, the display panel 10 may include only the curved area CVA. In such an embodiment, the display panel 10 may have a bent shape overall. In an alternative embodiment, the display panel 10 may include a flat area FA and a curved area CVA. The flat area FA may extend in one direction. In an embodiment, for example, the flat area FA may extend in a first direction. The flat area FA may be planar, that is, have a flat or level surface. The curved area CVA may extend from the flat area FA.

Referring to FIG. 1A, the curved area CVA may include a plurality of curved areas CVA. Each of the plurality of curved areas CVA may extend from an end of the flat area FA. Referring to FIG. 1B, the curved area CVA and the flat area FA may include the plurality of curved areas CVA and a plurality of flat areas FA, respectively. In an embodiment, the plurality of curved areas CVA and the plurality of flat areas FA may be alternately arranged with each other. Accordingly, the display panel 10 may have various shapes. Hereinafter, for convenience of description, embodiments having a shape of the display panel 10 shown in FIG. 1A will be described in detail.

The cover panel 20 may be disposed under the display panel 10. The cover panel 20 may include a plurality of layers. In an embodiment, the cover panel 20 may include a light-blocking layer, a cushion layer, an organic layer, and a metal layer. The light-blocking layer may prevent incidence of external light. In an embodiment, the light-blocking layer may include at least one selected from black dye and black particles.

The cushion layer may be disposed under the light-blocking layer. The cushion layer may include a buffering member for absorbing an external impact applied. The buffering member may be defined by a single layer or a plurality of layers. In an embodiment, for example, the buffering member may include polymer resin, such as polyurethane, polycarbonate, polypropylene, polyethylene, etc., or may include an elastic material, such as a sponge obtained by foam-molding rubber, a urethane-based material, or an acryl-based material.

The organic layer may be disposed under the cushion layer. The organic layer may include a synthetic resin film. In an embodiment, the organic layer may include thermo-setting resin. The organic layer may include at least one selected from polyimide-based resin, acryl-based resin, methacryl-based resin, polyisoprene, vinyl-based resin, epoxy-based resin, urethane-based resin, cellulose-based resin, siloxane-based resin, polyamide-based resin, and perylene-based resin.

The metal layer may be disposed under the organic layer. The metal layer may have a function of shielding from electromagnetic interference (EMI) and/or a function of dissipating heat. The metal layer may be a heat dissipation member for efficiently dissipating heat. In an embodiment, for example, the metal layer may include a metal material having high thermal conductivity, such as copper, nickel, ferrite, silver and/or aluminum.

In some embodiments, an adhesive member may be disposed between the plurality of layers of the cover panel 20. The adhesive member may include, for example, at least one selected from optically clear resin (OCR), optically clear adhesive (OCA), and pressure-sensitive adhesive (PSA). In some embodiments, the cover panel 20 may be omitted.

The ferromagnetic layer 30 may be disposed under the cover panel 20. The ferromagnetic layer 30 may include a ferromagnetic material. In an embodiment, for example, the ferromagnetic material may include at least one selected from iron, nickel, and cobalt. Although FIGS. 1A and 1B show an embodiment of the ferromagnetic layer 30 extending continuously, but not being limited thereto. In some embodiments, the ferromagnetic layer 30 may be partially disposed below the display panel 10. In some embodiments, the ferromagnetic layer 30 may be arranged in the curved area CVA and not in the flat area FA. In some embodiments, the ferromagnetic layer 30 may include a ferromagnetic layer opening, which is an opening defined in the ferromagnetic layer 30. In some embodiments, the ferromagnetic layer opening may overlap the flat area FA. In some embodiments, the ferromagnetic layer opening may include a plurality of ferromagnetic layer openings. In some embodiments, the ferromagnetic layer 30 may include an elastomer.

The ferromagnetic layer 30 may be used to bend the display panel 10. In an embodiment, the display panel 10 may be bent during a process of manufacturing the display device 1. In such an embodiment, the display panel 10 may be disposed above a shape transformation device including an electromagnet, and when a current is applied to the electromagnet, the ferromagnetic layer 30 may receive an attractive force by the electromagnet. Accordingly, the display panel 10 may be bent into a previously set shape.

When the display panel 10 is manufactured, the display panel 10 may be disposed above a shape transformation device including an electromagnet, and a magnetic field may be generated when a current is applied to the electromagnet. When the ferromagnetic layer 30 is entirely disposed below the display panel 10, the magnetic field may be shielded by the ferromagnetic layer 30. In an embodiment, for example, the magnetic field may be shielded by the movement of free electrons included in the ferromagnetic layer 30.

The adhesive layer 40 may be disposed on the display panel 10. In an embodiment, the display panel 10 may be disposed between the adhesive layer 40 and the cover panel 20. The adhesive layer 40 may include at least one selected from OCR, OCA, and PSA.

The cover window 50 may be disposed on the adhesive layer 40. In an embodiment, the display panel 10 may be disposed between the ferromagnetic layer 30 and the cover window 50. In an embodiment, the cover window 50 may be disposed above the ferromagnetic layer 30. The cover window 50 may protect the display panel 10. In an embodiment, the cover window 50 may be a flexible window. The cover window 50 may be easily bent by an external force without cracks and the like occurring to protect the display panel 10.

The cover window 50 may include glass, sapphire, or plastic. The cover window 50 may be, for example, ultra-thin glass or colorless polyimide.

Figure 2:
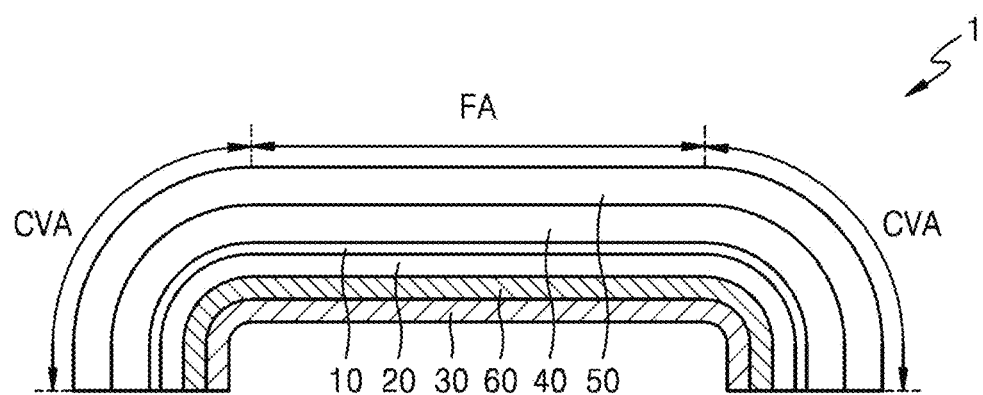
FIG. 2 is a schematic cross-sectional view of a display device according to an alternative embodiment.

FIG. 2 is a schematic cross-sectional view of the display device 1 according to an alternative embodiment. In FIG. 2, elements that are the same as those in FIG. 1A are designated by the same reference numerals, and any repetitive detailed description thereof will be omitted or simplified.

Referring to FIG. 2, an embodiment of the display device 1 may include the display panel 10, the cover panel 20, the ferromagnetic layer 30, the adhesive layer 40, the cover window 50, and an anti-magnetization layer 60. The anti-magnetization layer 60 may be disposed between the display panel 10 and the ferromagnetic layer 30. In an embodiment, the anti-magnetization layer 60 may be disposed between the cover panel 20 and the ferromagnetic layer 30. The anti-magnetization layer 60 may include a paramagnetic material and/or a diamagnetic material. The paramagnetic material may include, for example, aluminum. The diamagnetic material may include, for example, copper and/or zinc. In an embodiment, the anti-magnetization layer 60 may include a paramagnetic layer including a paramagnetic material, a diamagnetic layer including a diamagnetic material, or both a paramagnetic layer and a diamagnetic layer.

When the display panel 10 is manufactured, the display panel 10 may be disposed above a shape transformation device including an electromagnet, and a magnetic field may be generated when a current is applied to the electromagnet. Afterwards, the ferromagnetic layer 30 may be magnetized to maintain a magnetic force. In such an embodiment, damage to the display panel 10 due to the magnetic force may be effectively prevented or substantially reduced because the anti-magnetization layer 60 is disposed between the display panel 10 and the ferromagnetic layer 30.

Figure 3A:
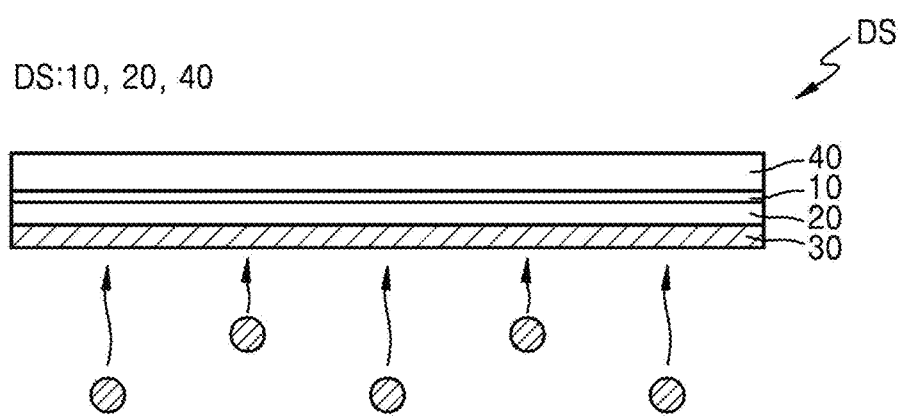
FIGS. 3A to 3C are each a cross-sectional view of a method of manufacturing a display device, according to an embodiment.
Figure 3B:
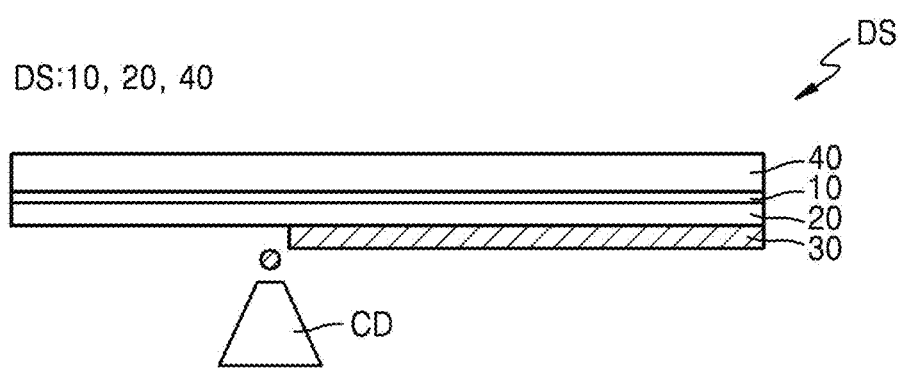
Figure 3C:
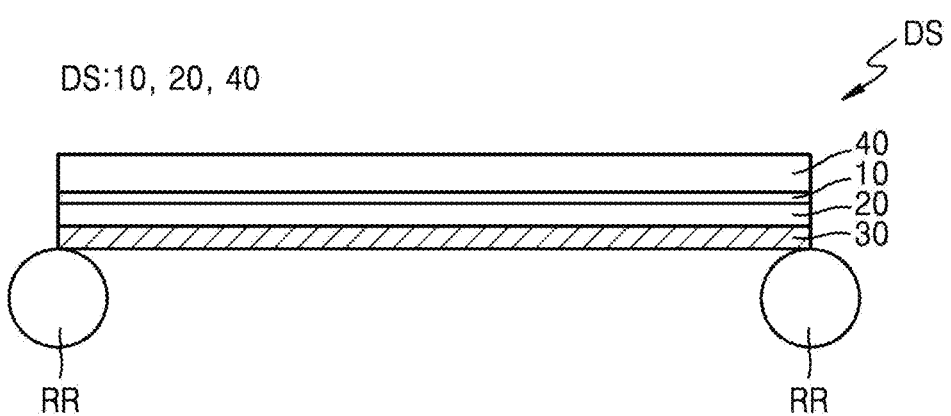
Figure 4:
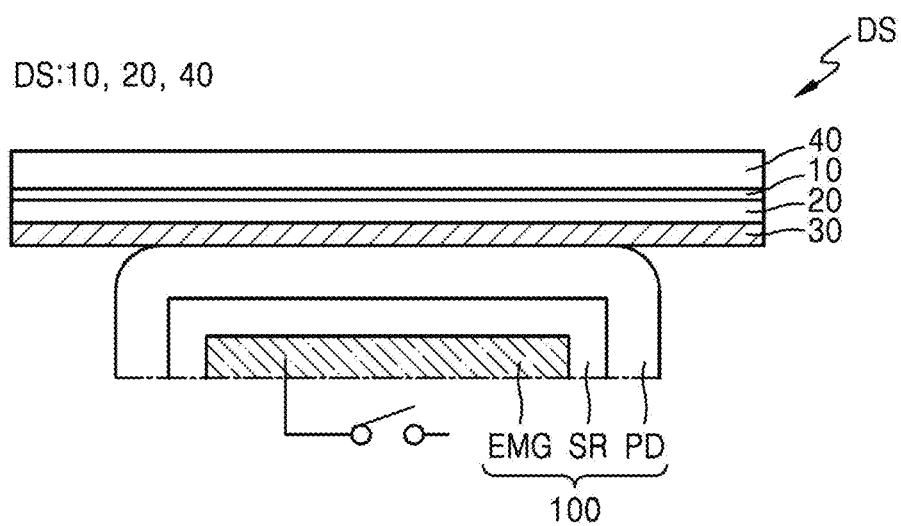
FIGS. 4 to 6 are cross-sectional views of a method of manufacturing a display device, according to an embodiment.
Figure 5:
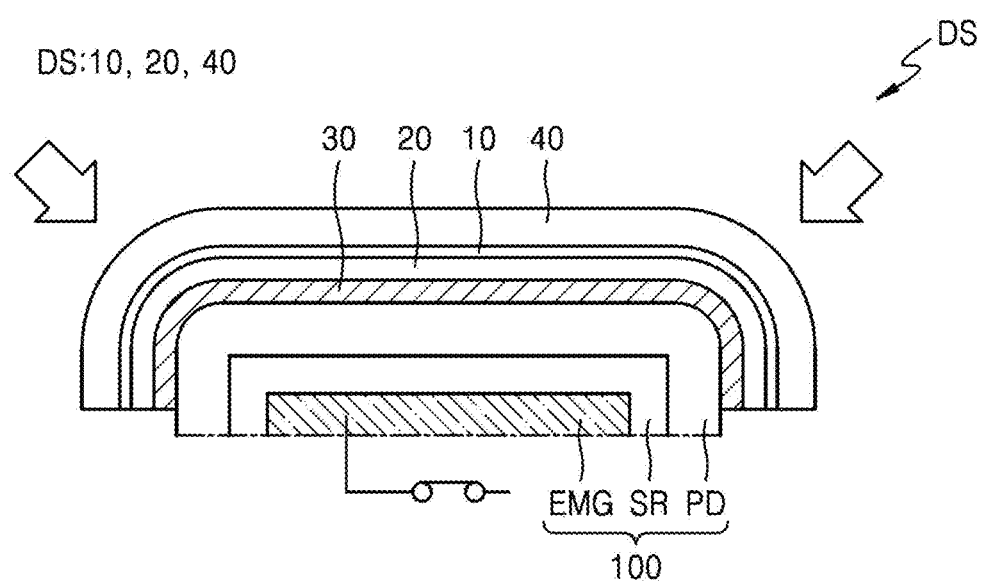
Figure 6:
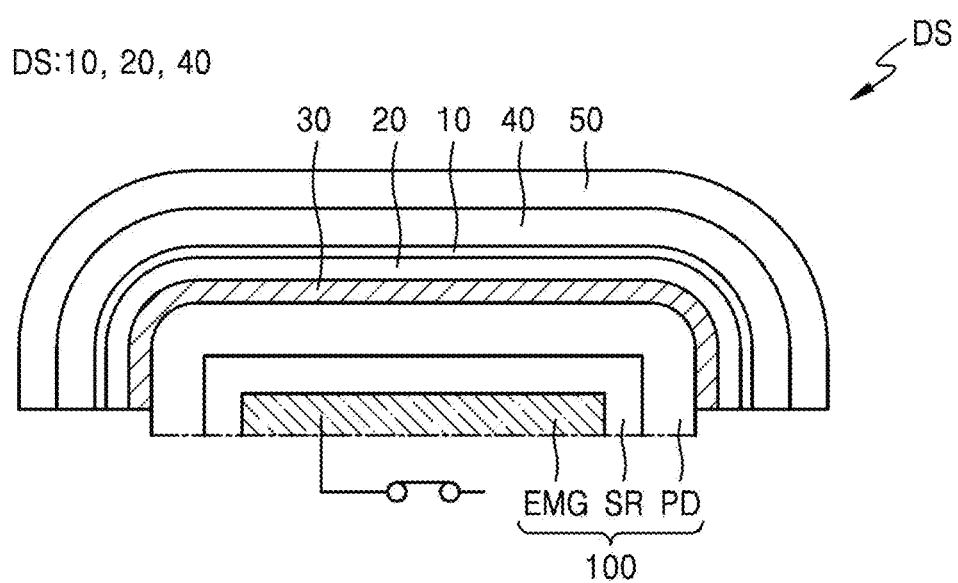

FIGS. 3A to 3C are each a cross-sectional view of a method of manufacturing a display device, according to an embodiment. FIGS. 4 to 6 are cross-sectional views of a method of manufacturing a display device, according to an embodiment. In FIGS. 3A to 6, elements that are the same as those in FIG. 1A are designated by the same reference numerals, and any repetitive detailed description thereof will be omitted or simplified.

Referring to FIGS. 3A to 3C, in an embodiment of a method of manufacturing a display device, a display substrate DS may be prepared. In an embodiment, the display substrate DS may include the display panel 10. In an embodiment, the display substrate DS may include the display panel 10, the cover panel 20, and the adhesive layer 40.

The ferromagnetic layer 30 may be provided or formed below the display panel 10. In an embodiment, the ferromagnetic layer 30 may be formed under the cover panel 20. The ferromagnetic layer 30 may include a ferromagnetic material. In an embodiment, for example, the ferromagnetic material may include at least one selected from iron, nickel, and cobalt. In an embodiment, the ferromagnetic layer 30 may be formed by one of a deposition process, a coating process, and a lamination process.

Referring to FIG. 3A, the ferromagnetic layer 30 may be provided or formed by a deposition process. In an embodiment, for example, one of iron, nickel, and cobalt may be deposited below the display panel 10.

Referring to FIG. 3B, the ferromagnetic layer 30 may be provided or formed by a coating process. In an embodiment, for example, a coating device CD may be used. The coating device CD may apply the ferromagnetic layer 30 below the display panel 10 with by combining a paste including a ferromagnetic material and a resin with each other.

Referring to FIG. 3C, the ferromagnetic layer 30 may be provided or formed by a lamination process. In an embodiment, for example, after a metal thin film including a ferromagnetic material is manufactured, the metal thin film may be laminated below the display panel 10 by using a roller RR.

Referring to FIG. 4, the display substrate DS may be disposed on a shape transformation device 100. The display substrate DS may be disposed in a way such that the ferromagnetic layer 30 faces the shape transformation device 100. The shape transformation device 100 may include an electromagnet EMG, a support SR, and a pad PD. The electromagnet EMG may be installed at the support SR. When a current is applied to the electromagnet EMG, an electric force and/or a magnetic force may be generated. The support SR may support the electromagnet EMG. The support SR may be disposed under the pad PD. The support SR may be defined by a frame of the shape transformation device 100. In some embodiments, the support SR may include stainless steel. The display substrate DS may be seated on the pad PD. The pad PD may include silicone.

Referring to FIG. 5, the display substrate DS may be bent. In an embodiment, a current may be applied to the electromagnet EMG, and an electric force and/or a magnetic force may be generated. The electric force and/or the magnetic force may be a force pulling the display substrate DS thereto. In an embodiment, an attractive force generated by the electromagnet EMG may be 500 gram-force per inch gf/in or greater. Accordingly, the display substrate DS may be bent. In such an embodiment, the electromagnet EMG may be mounted in the shape transformation device 100. In addition, a current may be applied to the electromagnet EMG, and the shape transformation device 100 may bend the display substrate DS. Accordingly, the display substrate DS may be transformed into various shapes.

Referring to FIG. 6, the cover window 50 may be disposed on the display substrate DS. After the display substrate DS is bent by applying a current to the electromagnet EMG, the cover window 50 may be disposed on the display substrate DS. The cover window 50 may be laminated on the display substrate DS. According to an embodiment, the cover window 50 may be laminated to the display substrate DS after the display substrate DS is previously bent by using the shape transformation device 100 including the electromagnet EMG. Accordingly, a display device may be manufactured in various shapes, and the reliability of a manufacturing method thereof may increase.

Figure 7:
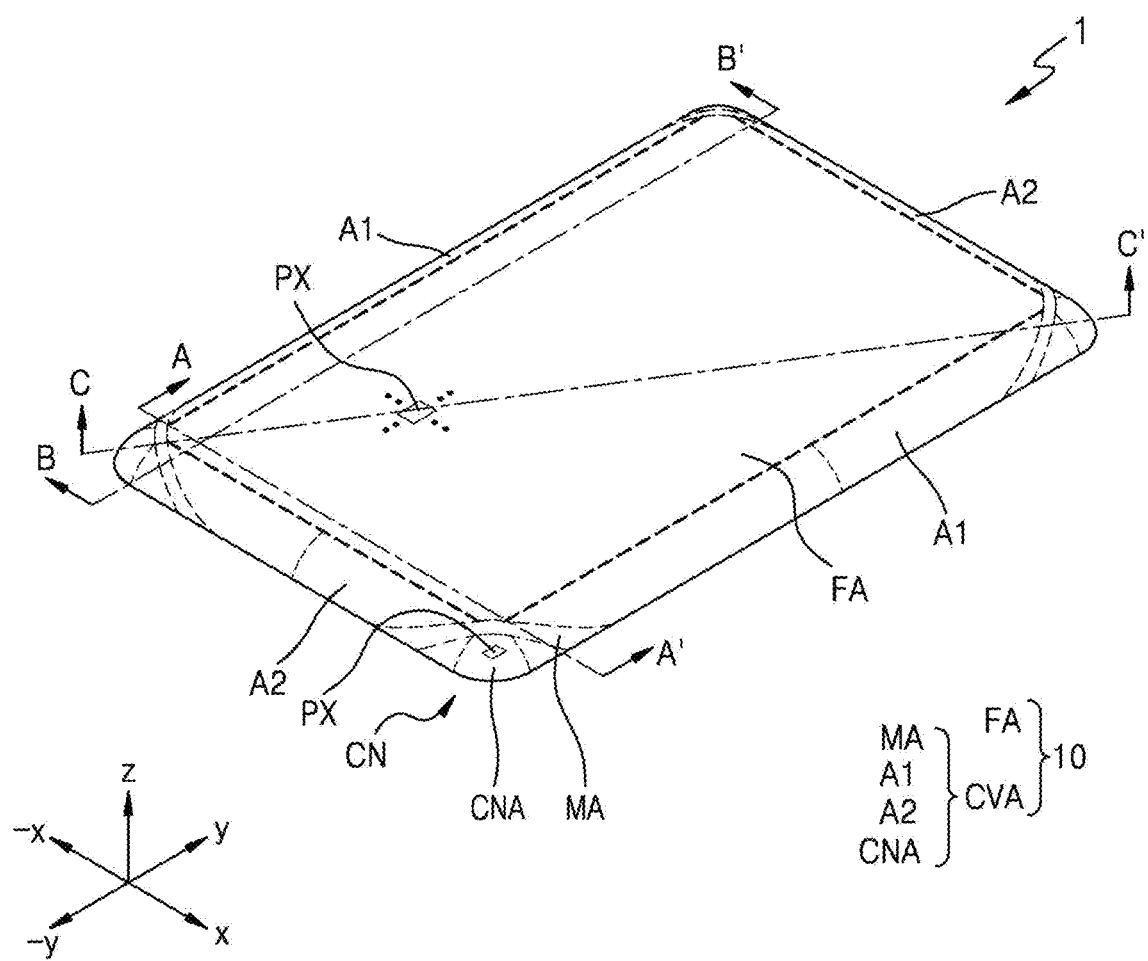
FIG. 7 is a schematic perspective view of a display device according to an alternative embodiment.
Figure 8A:
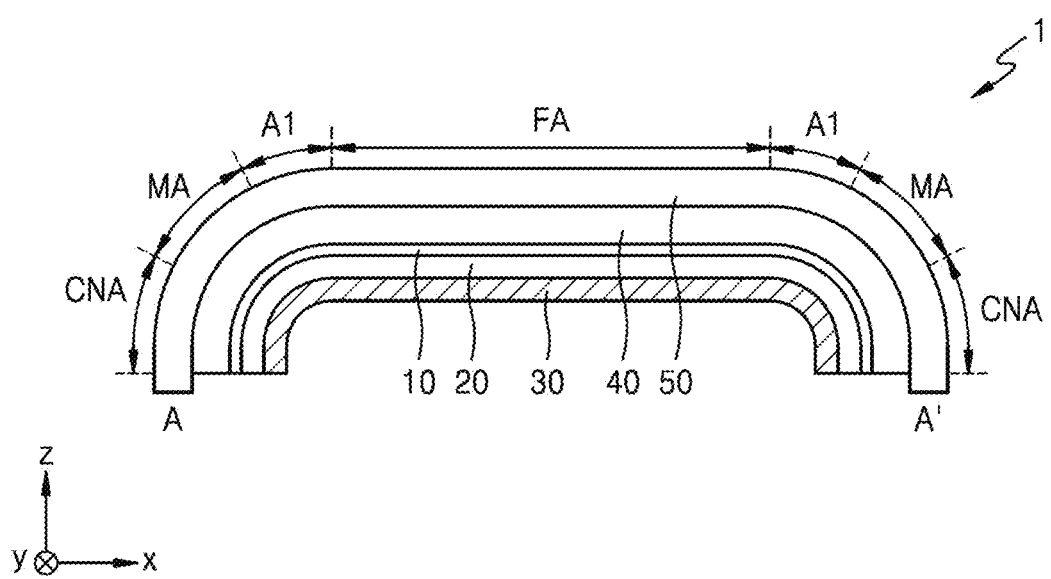
FIG. 8A is a cross-sectional view of the display device of FIG. 7, taken along line A-A'.
Figure 8B:
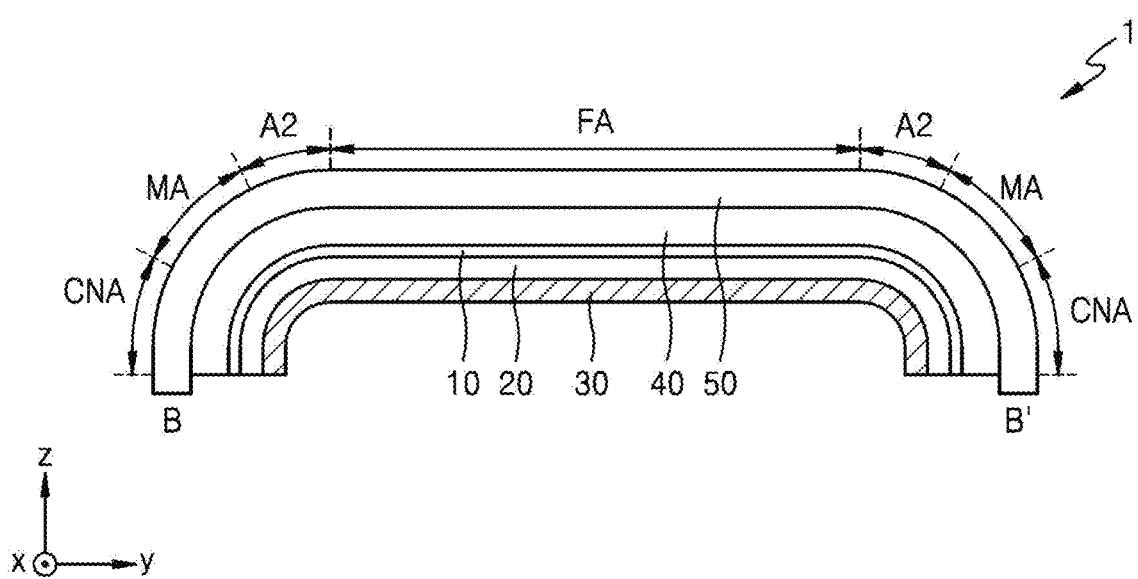
FIG. 8B is a cross-sectional view of the display device of FIG. 7, taken along line B-B'.
Figure 8C:
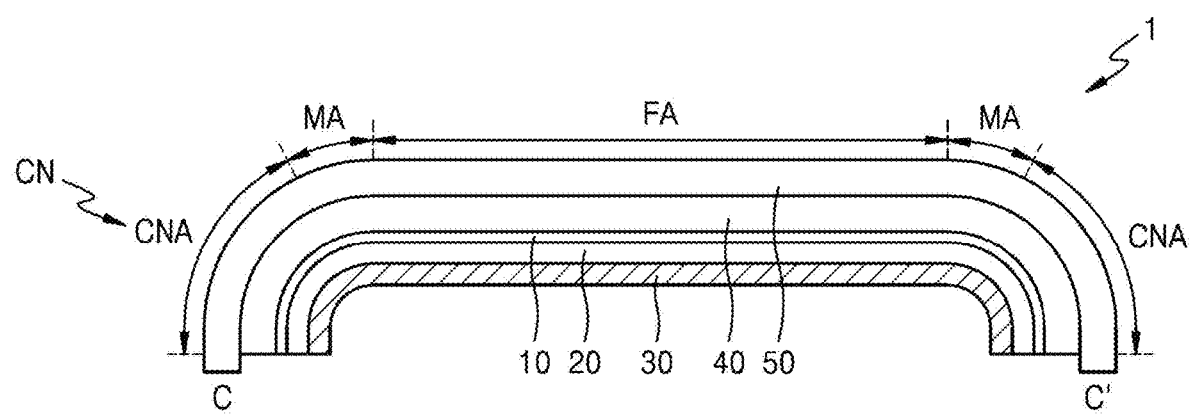
FIG. 8C is a cross-sectional view of the display device of FIG. 7, taken along line C-C'.

FIG. 7 is a schematic perspective view of the display device 1 according to an alternative embodiment. FIG. 8A is a cross-sectional view of the display device 1 of FIG. 7, taken along line A-A'. FIG. 8B is a cross-sectional view of the display device 1 of FIG. 7, taken along line B-B'. FIG. 8C is a cross-sectional view of the display device 1 of FIG. 7, taken along line C-C'. In FIGS. 7 to 8C, elements that are the same as those in FIG. 1A are designated by the same reference numerals, and any repetitive detailed description thereof will be omitted or simplified.

Referring to FIGS. 7 to 8C, an embodiment of the display device 1 may display an image. The display device 1 may have an edge in a first direction and an edge in a second direction. Here, the first direction and the second direction may be directions crossing each other. In an embodiment, for example, the first direction and the second direction may form an acute angle with respect to each other. In an alternative embodiment, for example, the first direction and the second direction may form an obtuse angle with respect to each other or may be orthogonal to each other. Hereinafter, an embodiment in which the first direction and the second direction are orthogonal to each other will be mainly described in detail. In an embodiment, for example, the first direction may be a direction x or a direction −x, and the second direction may be a direction y or a direction −y, as shown in FIG. 7.

The display device 1 may include the display panel 10, the cover panel 20, the ferromagnetic layer 30, the adhesive layer 40, and the cover window 50. In some embodiments, the display device 1 may further include an anti-magnetization layer. The anti-magnetization layer may be disposed between the ferromagnetic layer 30 and the cover panel 20.

The display panel 10 may display an image by using a pixel PX therein. The display panel 10 may include the flat area FA and the curved area CVA. In an embodiment, the display device 1 may provide most of the image in the flat area FA. A plurality of pixels PX may be arranged in the flat area FA.

The curved area CVA may be arranged outside the flat area FA. The curved area CVA may extend from the flat area FA. The curved area CVA may at least partially surround the flat area FA when viewed from a plan view in a third direction which is orthogonal to the first and second directions, that is, a direction z or a thickness direction of the display panel 10. In an embodiment, the curved area CVA may entirely surround the flat area FA when viewed from the plan view in the third direction. The curved area CVA may be bent. In an embodiment, for example, the curved area CVA may be bent around an axis in the first direction (e.g., the direction x or the direction −x) or may be bent around an axis in the second direction (e.g., the direction y or the direction −y). Alternatively, the curved area CVA may be bent around an axis in a direction crossing the first direction (e.g., the direction x or the direction −x) and the second direction (e.g., the direction y or the direction −y). The plurality of pixels PX may be arranged in the curved area CVA, and an image may be provided by the curved area CVA. In an alternative embodiment, no pixel PX may be arranged in the curved area CVA, and no image may be provided by the curved area CVA. Hereinafter, an embodiment in which the plurality of pixels PX are arranged in the curved area CVA will be mainly described in detail.

The curved area CVA may include a first adjacent area A1, a second adjacent area A2, a corner area CNA, and a middle area MA. The first adjacent area A1 may be bent. The first adjacent area A1 may be adjacent to the flat area FA in the first direction (e.g., the direction x or the direction −x). The first adjacent area A1 may be defined as an area bent from the flat area FA at a cross-section (e.g., an xz cross-section) in the first direction (e.g., the direction x or the direction −x). The first adjacent area A1 may extend in the second direction (e.g., the direction y or the direction −y). In such an embodiment, the first adjacent area A1 may not be bent at a cross-section (e.g., a yz cross-section) in the second direction (e.g., the direction y or the direction −y). The first adjacent area A1 may be an area bent around an axis extending in the second direction (e.g., the direction y or the direction −y). In FIG. 8A, the first adjacent area A1 extending from the flat area FA in the direction x and bent and the first adjacent area A1 extending from the flat area FA in the direction −x and bent are shown as having a same curvature (or a radius of curvature) as each other. However, in an alternative embodiment, the first adjacent area A1 extending from the flat area FA in the direction x and bent and the first adjacent area A1 extending from the flat area FA in the direction −x and bent may have different curvatures from each other.

The second adjacent area A2 may be bent. The second adjacent area A2 may be adjacent to the flat area FA in the second direction (e.g., the direction y or the direction −y). The second adjacent area A2 may be defined as an area bent from the flat area FA at a cross-section (e.g., the yz cross-section) in the second direction (e.g., the direction y or the direction −y). The second adjacent area A2 may extend in the first direction (e.g., the direction x or the direction −x). In such an embodiment, the second adjacent area A2 may not be bent at a cross-section (e.g., the xz cross-section) in the first direction (e.g., the direction x or the direction −x). The second adjacent area A2 may be an area bent around an axis extending in the first direction (e.g., the direction x or the direction −x). In FIG. 8B, the second adjacent area A2 extending from the flat area FA in the direction y and bent and the second adjacent area A2 extending from the flat area FA in the direction −y and bent are shown as having the same curvature as each other. However, in an alternative embodiment, the second adjacent area A2 extending from the flat area FA in the direction y and bent and the second adjacent area A2 extending from the flat area FA in the direction −y and bent may have different curvatures from each other.

The corner area CNA may be bent. In an embodiment, a corner CN where an edge in the first direction (e.g., the direction x or the direction −x) and an edge in the second direction (e.g., the direction y or the direction −y) meet each other may have a certain curvature. The corner area CNA may be an area arranged at the corner CN. In an embodiment, the corner area CNA may be an area where an edge of the display device 1 in the first direction (e.g., the direction x or the direction −x) and an edge of the display device 1 in the second direction (e.g., the direction y or the direction −y) meet each other. In an embodiment, the corner area CNA may at least partially surround the flat area FA, the first adjacent area A1, and the second adjacent area A2. The corner area CNA may at least partially surround the flat area FA, the first adjacent area A1, the second adjacent area A2, and the middle area MA. In such an embodiment, where the first adjacent area A1 extends in the first direction (e.g., the direction x or the direction −x) and is bent, and the second adjacent area A2 extends in the second direction (e.g., the direction y or the direction −y) and is bent, at least a portion of the corner area CNA may extend in the first direction (e.g., the direction x or the direction −x) and be bent and may extend in the second direction (e.g., the direction y or the direction −y) and be bent. In such an embodiment, at least a portion of the corner area CNA may be a multiple curved area where a plurality of curvatures in a plurality of directions overlap each other. In an embodiment, the corner area CNA may include a plurality of corner areas CNA.

The middle area MA may be arranged between the flat area FA and the corner area CNA. In an embodiment, the middle area MA may extend between the first adjacent area A1 and the corner area CNA. In an embodiment, the middle area MA may extend between the second adjacent area A2 and the corner area CNA. In an embodiment, the middle area MA may be bent.

In an alternative embodiment, the corner area CNA and the middle area MA may be omitted. In such an embodiment, the curved area CVA may include the first adjacent area A1 and the second adjacent area A2. In another alternative embodiment, the curved area CVA may include one of the first adjacent area A1 and the second adjacent area A2. In such an embodiment, one of the first adjacent area A1 and the second adjacent area A2, the corner area CNA, and the middle area MA may be omitted. Hereinafter, an embodiment in which the curved area CVA includes the first adjacent area A1, the second adjacent area A2, the corner area CNA, and the middle area MA will be mainly described in detail.

The pixel PX may be implemented as a light-emitting element. In an embodiment, the pixel PX may include a plurality of pixels PX, and the plurality of pixels PX may display an image by emitting light. In an embodiment, each of the plurality of pixels PX may include a red sub-pixel, a green sub-pixel, and a blue sub-pixel. Alternatively, each of the plurality of pixels PX may include a red sub-pixel, a green sub-pixel, a blue sub-pixel, and a white sub-pixel.

The pixel PX may be arranged in the flat area FA. In an embodiment, the pixel PX may be arranged in at least one selected from the flat area FA, the first adjacent area A1, the second adjacent area A2, the corner area CNA, and the middle area MA. In such an embodiment, the display device 1 may display an image in at least one selected from the flat area FA, the first adjacent area A1, the second adjacent area A2, the corner area CNA, and the middle area MA. Accordingly, a proportion of a display area, which is an area displaying an image, in the display device 1 may increase. In such an embodiment, aesthetics may improve because the display device 1 may display an image while being bent at the curved area CVA.

Figure 9:
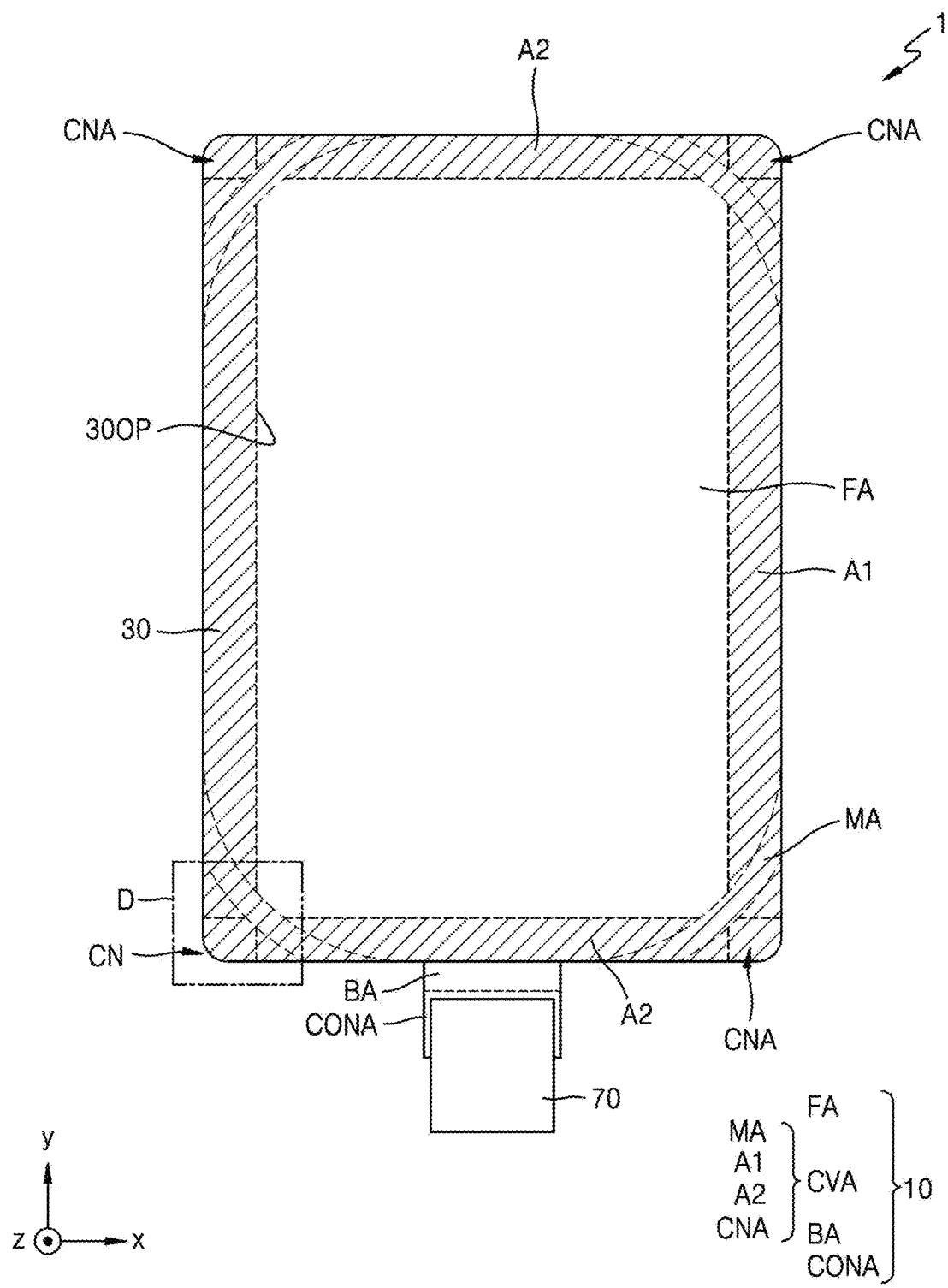
FIGS. 9 and 10 are each a schematic plan view of a display device according to an alternative embodiment.
Figure 10:
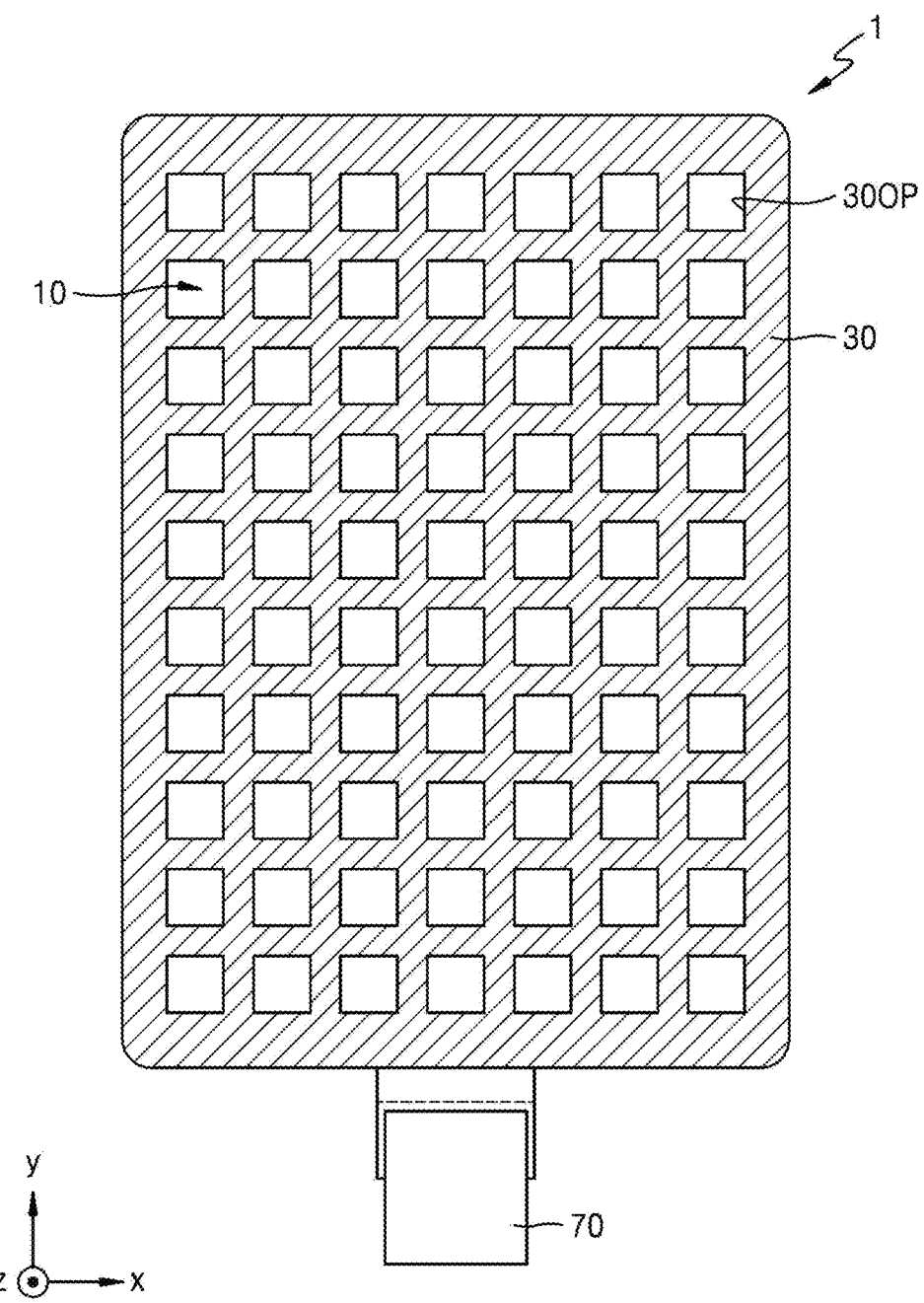

FIGS. 9 and 10 are each a schematic plan view of the display device 1 according to an alternative embodiment. FIGS. 9 and 10 are schematic plan views of the display device 1 in an unbent state. In FIGS. 9 and 10, elements that are the same as those in FIG. 7 are designated by the same reference numerals, and any repetitive detailed description thereof will be omitted or simplified.

Referring to FIG. 9, an embodiment of the display device 1 may include the display panel 10, the ferromagnetic layer 30, and a printed circuit board 70. The display panel 10 may include the flat area FA, the curved area CVA, a bending area BA, and a connection area CONA. The curved area CVA may include the first adjacent area A1, the second adjacent area A2, the corner area CNA, and the middle area MA. The bending area BA may be arranged outside the second adjacent area A2 or the first adjacent area A1. In an embodiment, the bending area BA may be arranged outside the second adjacent area A2. The display panel 10 may be bent at the bending area BA. In such an embodiment, the connection area CONA may face a rear surface of the display panel 10 opposite to a top surface of the display panel 10 displaying an image. Accordingly, the connection area CONA may not be visible to a user.

The connection area CONA may be arranged outside the bending area BA. In an embodiment, the bending area BA may be arranged between the second adjacent area A2 and the connection area CONA. A connection pad (not shown) may be arranged in the connection area CONA. The display panel 10 may receive an electrical signal and/or a power voltage from the printed circuit board 70 through the connection pad.

The ferromagnetic layer 30 may be disposed under the display panel 10. The ferromagnetic layer 30 may include a ferromagnetic material. In an embodiment, for example, the ferromagnetic material may include at least one selected from iron, nickel, and cobalt. The ferromagnetic layer 30 may include a ferromagnetic layer opening 300P overlapping the flat area FA. The ferromagnetic layer 30 may be arranged in the curved area CVA and not in the flat area FA.

The ferromagnetic layer 30 may be used to bend the display panel 10. Because the display panel 10 is bent at the curved area CVA and is not bent at the flat area FA, the ferromagnetic layer 30 may be arranged only in the curved area CVA. Accordingly, the ferromagnetic layer 30 may be arranged only in the curved area CVA requiring transformation.

The printed circuit board 70 may be connected to the display panel 10 through an anisotropic conductive film. The printed circuit board 70 may be a flexible printed circuit board (FPCB), or a rigid printed circuit board (Rigid PCB), which is solid and does not bend easily. Alternatively, in some embodiments, the printed circuit board 70 may be a complex printed circuit board including both an Rigid PCB and an FPCB. In an embodiment, a chip including an integrated circuit (IC) may be disposed on the printed circuit board 70. In some embodiments, the display panel 10 may further include a driving chip for transmitting an electrical signal and/or a power voltage. The driving chip may be arranged in the connection area CONA and may include an IC.

Referring to FIG. 10, an alternative embodiment of the display device 1 may include the display panel 10, the ferromagnetic layer 30, and the printed circuit board 70. The ferromagnetic layer 30 may be disposed under the display panel 10. The ferromagnetic layer 30 may include a ferromagnetic material. In an embodiment, for example, the ferromagnetic material may include at least one selected from iron, nickel, and cobalt. The ferromagnetic layer 30 may include a plurality of ferromagnetic layer openings 30OP. The plurality of ferromagnetic layer openings 30OP may be apart from each other. Although FIG. 10 shows an embodiment in which the plurality of ferromagnetic layer openings 30OP are apart from each other at a same distance, one or more embodiments are not limited thereto.

Although FIG. 10 shows an embodiment in which the plurality of ferromagnetic layer openings 30OP having a same shape as each other are defined, one or more embodiments are not limited thereto. In an alternative embodiment, a shape of one ferromagnetic layer opening 30OP from among the plurality of ferromagnetic layer openings 30OP and a shape of another ferromagnetic layer opening 30OP from among the plurality of ferromagnetic layer openings 30OP may be different from each other.

The ferromagnetic layer 30 may be used to bend the display panel 10. In such an embodiment, the ferromagnetic layer 30 may include the plurality of ferromagnetic layer openings 30OP, and thus, an electric force and/or a magnetic force used to bend the ferromagnetic layer 30 may decrease.

Figure 11:
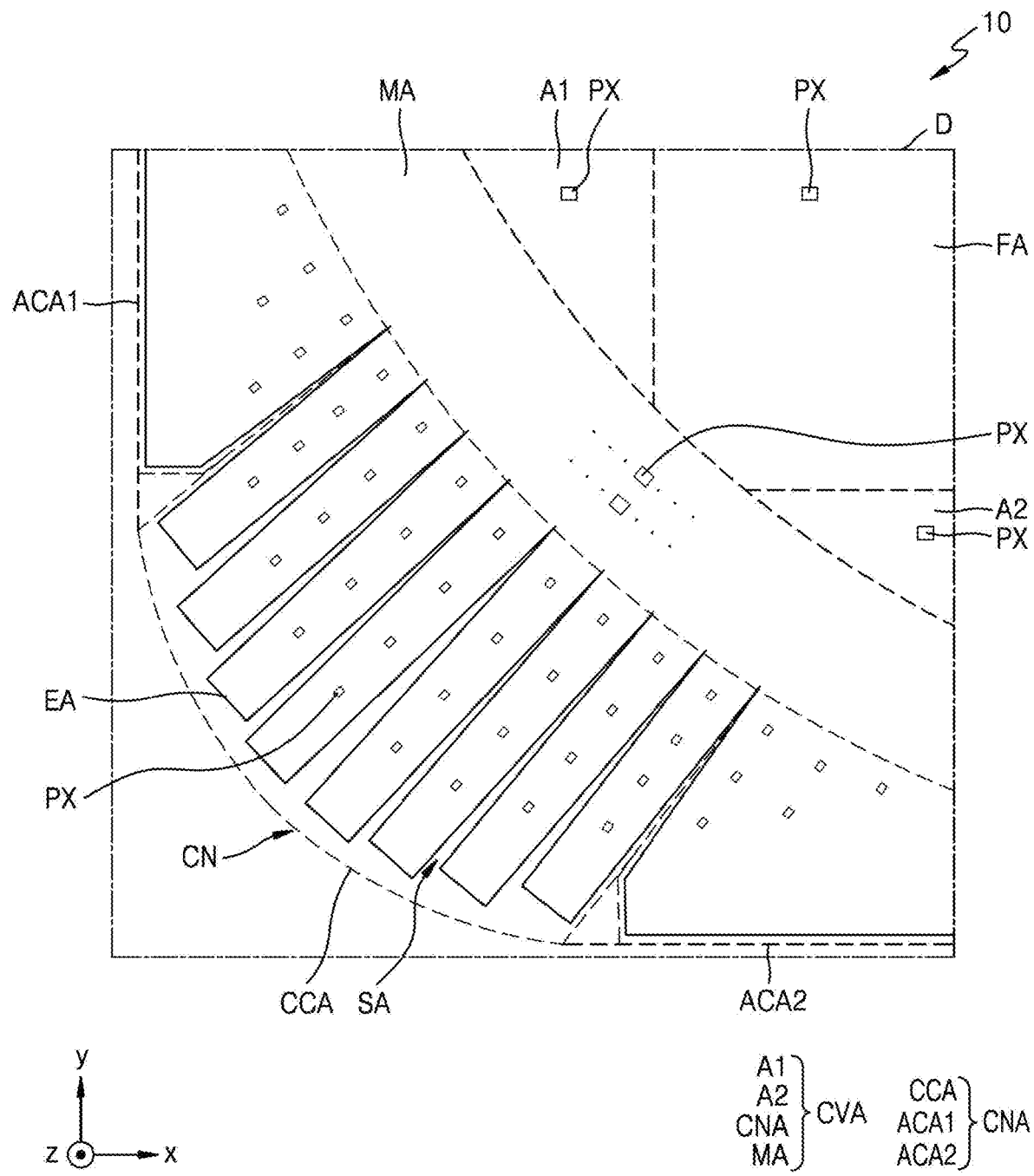
FIG. 11 is an enlarged view of region D of a display panel of FIG. 9.

FIG. 11 is an enlarged view of region D of the display panel 10 of FIG. 9. In FIG. 11, elements that are the same as those in FIG. 9 are designated by the same reference numerals, and any repetitive detailed description thereof will be omitted or simplified.

Referring to FIG. 11, an embodiment of the display panel 10 may include the flat area FA and the curved area CVA. The curved area CVA may be arranged outside the flat area FA. The curved area CVA may at least partially surround the flat area FA. In an embodiment, the curved area CVA may include the first adjacent area A1, the second adjacent area A2, the corner area CNA, and the middle area MA.

The first adjacent area A1 may be adjacent to the flat area FA in a first direction (e.g., the direction x or the direction −x). The second adjacent area A2 may be adjacent to the flat area FA in a second direction (e.g., the direction y or the direction −y). The corner area CNA may be an area arranged at the corner CN of the display panel 10. In an embodiment, the corner area CNA may be an area where an edge of the display panel 10 in the first direction (e.g., the direction x or the direction −x) and an edge of the display panel 10 in the second direction (e.g., the direction y or the direction −y) meet each other. In an embodiment, the corner area CNA and the middle area MA may at least partially surround the flat area FA, the first adjacent area A1, and the second adjacent area A2. The corner area CNA may at least partially surround the flat area FA, the first adjacent area A1, the second adjacent area A2, and the middle area MA. The corner area CNA may include a central corner area CCA, a first adjacent corner area ACA1, and a second adjacent corner area ACA2.

The central corner area CCA may include an extension area EA. The extension area EA may extend in a direction away from the flat area FA. In an embodiment, the extension area EA may include a plurality of extension areas EA. Each of the plurality of extension areas EA may extend in a direction away from the flat area FA. In an embodiment, the plurality of extension areas EA may extend in a direction crossing the first direction (e.g., the direction x or the direction −x) and the second direction (e.g., the direction y or the direction −y).

A space area SA may be defined between adjacent extension areas EA from among the plurality of extension areas EA. The space area SA may be an area where elements of the display panel 10 are not arranged. In a state where the central corner area CCA is bent at the corner CN, compressive strain may be greater than tensile strain in the central corner area CCA. In an embodiment, the space area SA is defined between the adjacent extension areas EA, and thus, the central corner area CCA may contract. Accordingly, the display panel 10 may be bent without damaging the central corner area CCA.

The first adjacent corner area ACA1 may be adjacent to the central corner area CCA. In an embodiment, at least a portion of the first adjacent area A1 and the first adjacent corner area ACA1 may be arranged in the first direction (e.g., the direction x or the direction −x). Adjacent ends of the central corner area CCA and the first adjacent corner area ACA1 may be apart from each other. The first adjacent corner area ACA1 is an area bent at a cross-section (e.g., the xz cross-section) in the first direction (e.g., the direction x or the direction −x) and not bent at a cross-section (e.g., the yz cross-section) in the second direction (e.g., the direction y or the direction −y), and the space area SA may not be defined in the first adjacent corner area ACA1.

The second adjacent corner area ACA2 may be adjacent to the central corner area CCA. At least a portion of the second adjacent area A2 may be arranged between the flat area FA and the second adjacent corner area ACA2 in the second direction (e.g., the direction y or the direction −y). Adjacent ends of the central corner area CCA and the second adjacent corner area ACA2 may be apart from each other. The second adjacent corner area ACA2 is an area not bent at a cross-section (e.g., the xz cross-section) in the first direction (e.g., the direction x or the direction −x) and bent at a cross-section (e.g., the yz cross-section) in the second direction (e.g., the direction y or the direction −y), and the space area SA may not be defined in the second adjacent corner area ACA2.

The plurality of pixels PX may be arranged in the flat area FA, the first adjacent area A1, the second adjacent area A2, the corner area CNA, and the middle area MA. Accordingly, the display panel 10 may display an image in the flat area FA, the first adjacent area A1, the second adjacent area A2, the corner area CNA, and the middle area MA. The plurality of pixels PX may be arranged in an extension direction of the plurality of extension areas EA.

Figure 12:
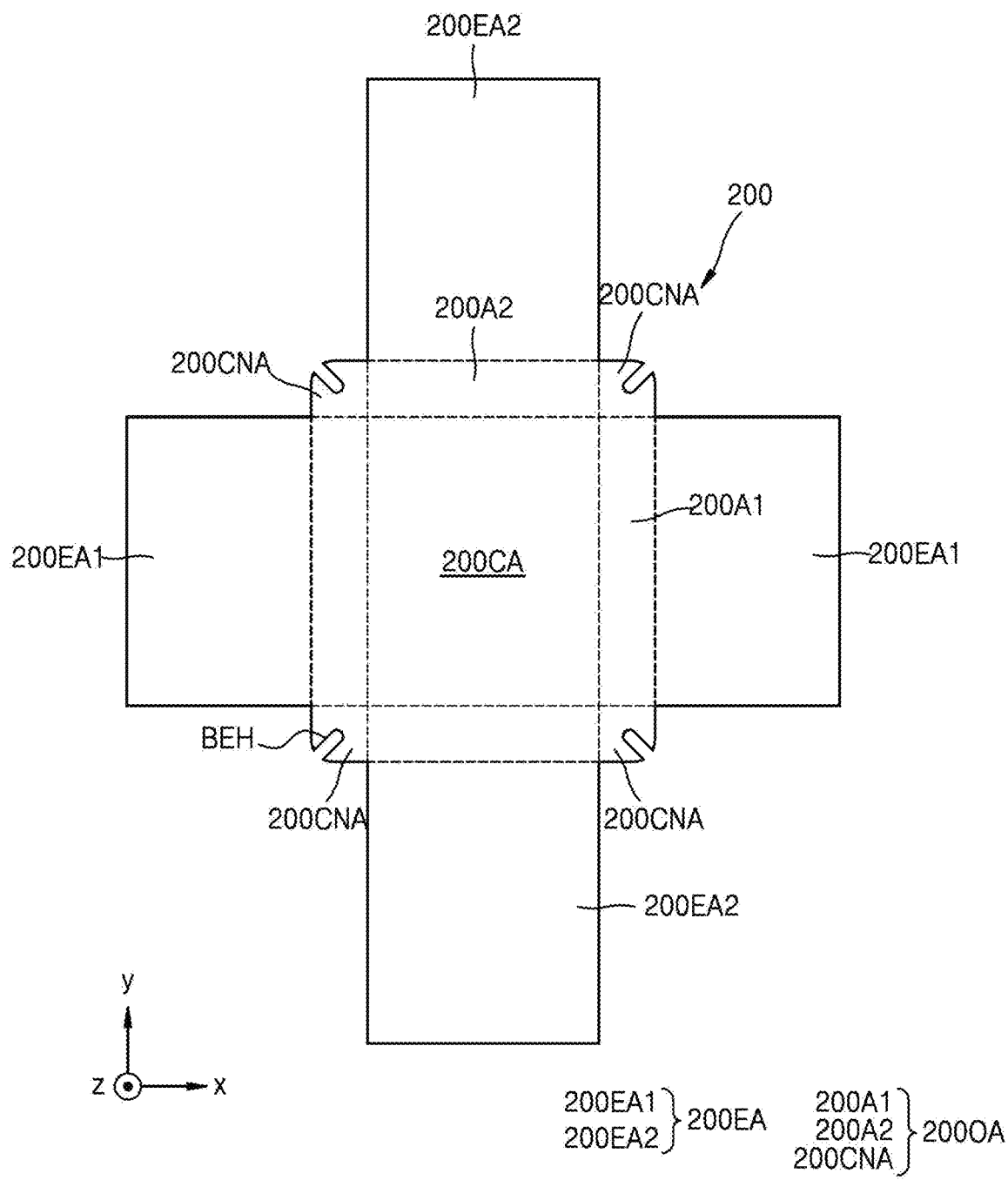
FIG. 12 is a plan view of a guide film according to an embodiment.

FIG. 12 is a plan view of a guide film 200 according to an embodiment.

Referring to FIG. 12, in an embodiment of a method of manufacturing a display device, the guide film 200 may be prepared. The guide film 200 may include a guide central area 200OA, a guide outer area 200OA, and a guide extension area 200EA. The guide outer area 200OA may be arranged outside the guide central area 200OA. The guide outer area 200OA may include a first guide adjacent area 200A1, a second guide adjacent area 200A2, and a guide corner area 200ONA.

The first guide adjacent area 200A1 may be adjacent to the guide central area 200OA in a first direction (e.g., the direction x or the direction -x). The second guide adjacent area 200A2 may be adjacent to the guide central area 200CA in a second direction (e.g., the direction y or the direction -y). The guide corner area 200CNA may be arranged between the first guide adjacent area 200A1 and the second guide adjacent area 200A2. In an embodiment, the guide corner area 200CNA may include a plurality of guide corner areas 200CNA. In an embodiment, the guide corner area 200CNA may include a cutout groove BEH.

The guide extension area 200EA may extend outwardly from the guide outer area 200OA. In an embodiment, the guide extension area 200EA may include a first guide extension area 200EA1 and a second guide extension area 200EA2. The first guide extension area 200EA1 may extend from the first guide adjacent area 200A1 in the first direction (e.g., the direction x or the direction -x). The second guide extension area 200EA2 may extend from the second guide adjacent area 200A2 in the second direction (e.g., the direction y or the direction -y).

Although FIG. 12 shows an embodiment where the guide film 200 includes four guide extension areas 200EA, one or more embodiments are not limited thereto, and fewer or more than four guide extension areas 200EA may be provided depending on the shape of a display panel. In addition, although FIG. 12 shows an embodiment where the guide extension area 200EA has a quadrilateral shape in a plan view, one or more embodiments are not limited thereto, and the guide extension area 200EA may have one of other various shapes, such as a polygon, such as a triangle, a part of a circle, or a part of an oval.

FIGS. 13A to 13E are diagrams showing a method of manufacturing a display device, according to an alternative embodiment.

Figure 13A:
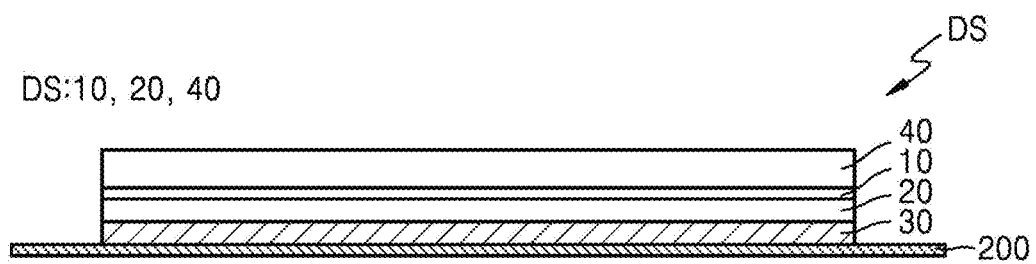
FIGS. 13A to 13E are diagrams showing a method of manufacturing a display device, according to an alternative embodiment.

Referring to FIG. 13A, in an embodiment of a method of manufacturing a display device, the display substrate DS may be prepared. In an embodiment, the display substrate DS may include the display panel 10. In an embodiment, the display substrate DS may include the display panel 10, the cover panel 20, and the adhesive layer 40. The ferromagnetic layer 30 may be provided or formed below the display panel 10. In an embodiment, the ferromagnetic layer 30 may be formed under the cover panel 20. The ferromagnetic layer 30 may include a ferromagnetic material. In an embodiment, for example, the ferromagnetic material may include at least one selected from iron, nickel, and cobalt. In an embodiment, the ferromagnetic layer 30 may be provided or formed by one of a deposition process, a coating process, and a lamination process.

The display substrate DS may be disposed on the guide film 200. In an embodiment, the display substrate DS may be arranged in the guide central area 200CA (refer to FIG. 12) and the guide outer area 200OA (refer to FIG. 12) of the guide film 200. In an embodiment, the display substrate DS may be disposed on the guide film 200 in a way such that a flat area of the display panel 10 may overlap the guide central area 200CA of the guide film 200, and a curved area of the display panel 10 may overlap the guide outer area 200OA of the guide film 200. The guide extension area 200EA (refer to FIG. 12) of the guide film 200 may not overlap the display panel 10.

Figure 13B:
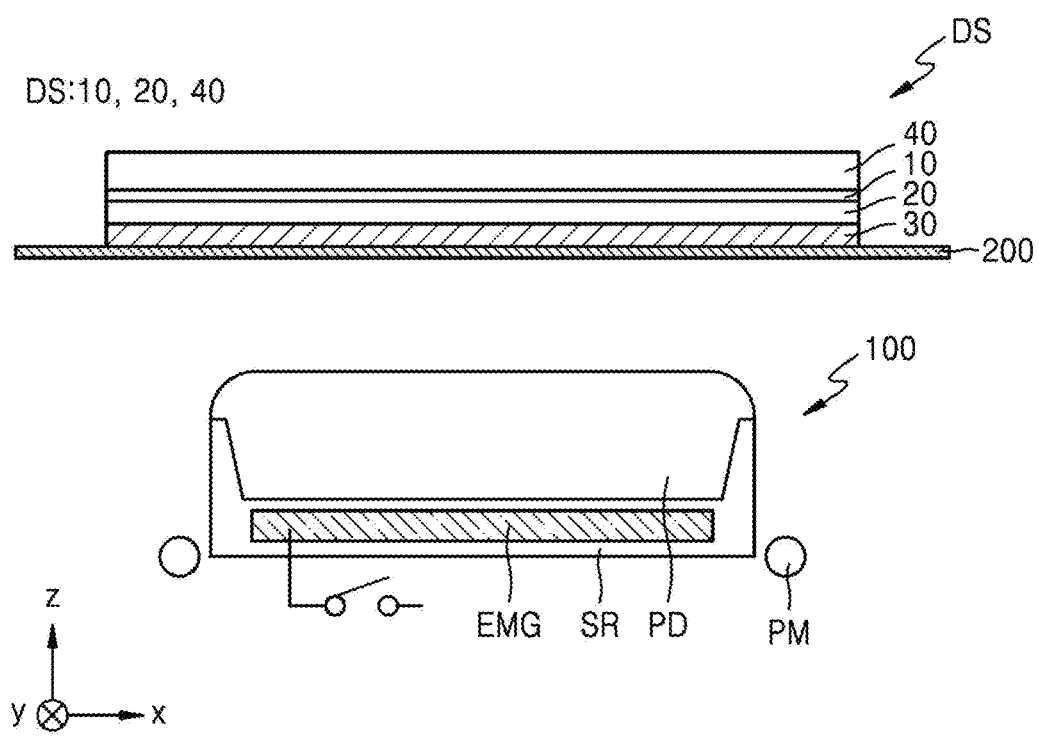

Referring to FIG. 13B, the shape transformation device 100 may be prepared. The shape transformation device 100 may include the electromagnet EMG, the support SR, the pad PD, and a push member PM. The electromagnet EMG may be installed at the support SR. When a current is applied to the electromagnet EMG, an electric force and/or a magnetic force may be generated. The support SR may support the electromagnet EMG. The support SR may be disposed under the pad PD. The support SR may be defined by a frame of the shape transformation device 100. In some embodiments, the support SR may include stainless steel. The display substrate DS may be seated on the pad PD. The pad PD may include silicone.

The display substrate DS may be disposed over the shape transformation device 100. The ferromagnetic layer 30 may face the shape transformation device 100. The display substrate DS and the shape transformation device 100 may be aligned with each other. In an embodiment, for example, the display substrate DS and the shape transformation device 100 may be aligned with each other so that a first alignment mark (not shown) marked on the display substrate DS and a second alignment mark (not shown) marked on the shape transformation device 100 coincide with each other.

Figure 13C:
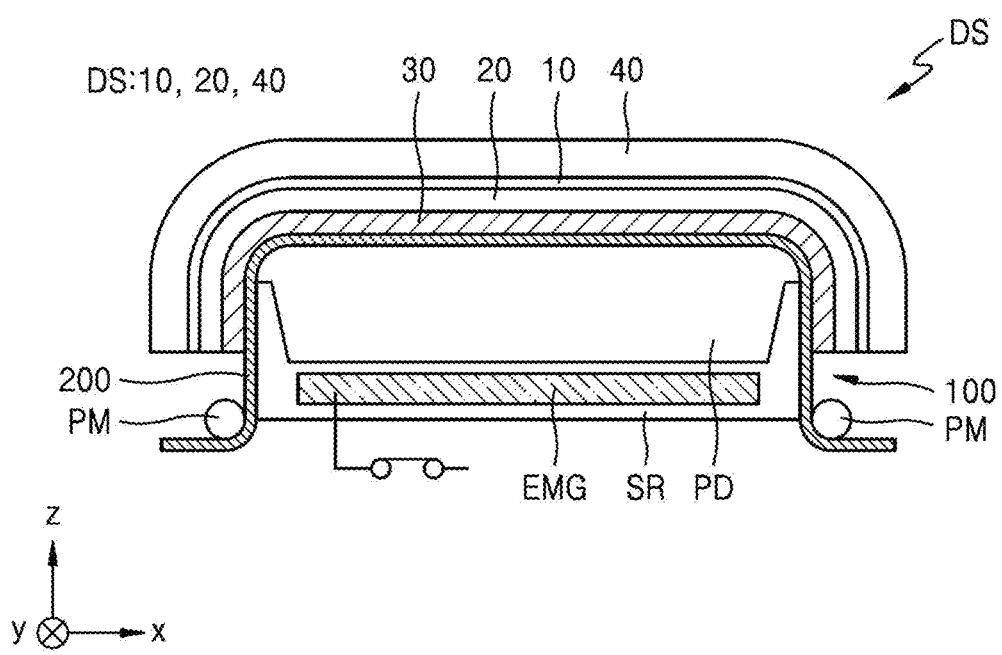
Figure 13D:
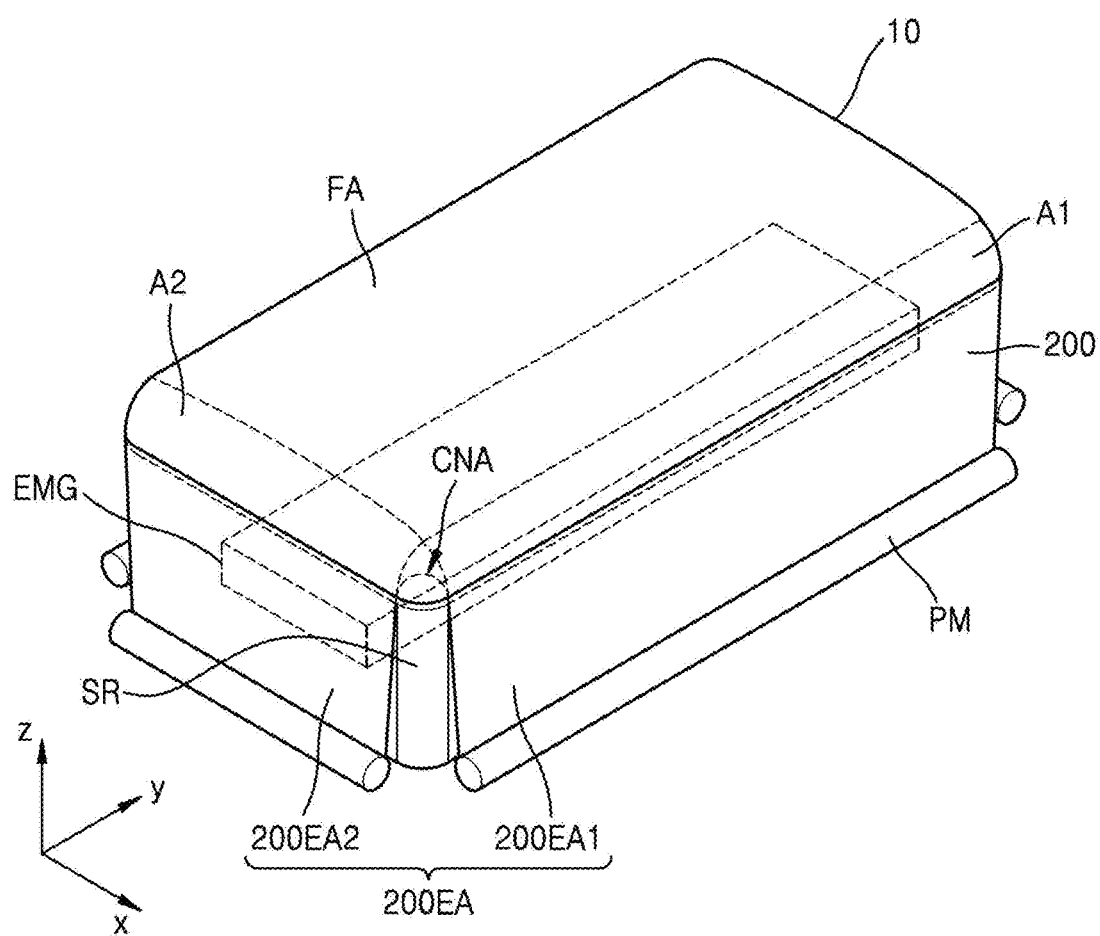

Referring to FIGS. 13C and 13D, the display substrate DS may be transformed by the guide film 200. In an embodiment, the guide film 200 may be seated on the shape transformation device 100. The push member PM may be on the guide film 200, and the guide film 200 may be closely attached to a side surface of the support SR by using the push member PM. In an embodiment, for example, push members PM may press the first guide extension area 200EA1 and the second guide extension area 200EA2 of the guide film 200, thereby applying a tensile force to the first guide extension area 200EA1 and the second guide extension area 200EA2. In such an embodiment, the guide film 200 may be transformed along an outer surface of the shape transformation device 100. In addition, the display substrate DS disposed on the guide film 200 may also be bent. Accordingly, the first adjacent area A1 and the second adjacent area A2 may be bent.

When a tensile force is applied to the first guide extension area 200EA1 and the second guide extension area 200EA2, a current may be applied to the electromagnet EMG. Accordingly, the shape transformation device 100 may bend the display substrate DS. In such an embodiment, the corner area CNA of the display substrate DS may be bent. Accordingly, the first adjacent area A1, the second adjacent area A2, and the corner area CNA may be bent simultaneously.

The corner area CNA is an area where a plurality of curvatures overlap each other, and may not be bent by the guide film 200 and the push member PM. In such an embodiment, because the guide film 200 and the push member PM are used, and the shape transformation device 100 includes the electromagnet EMG, the first adjacent area A1, the second adjacent area A2, and the corner area CNA may be bent simultaneously.

Figure 13E:
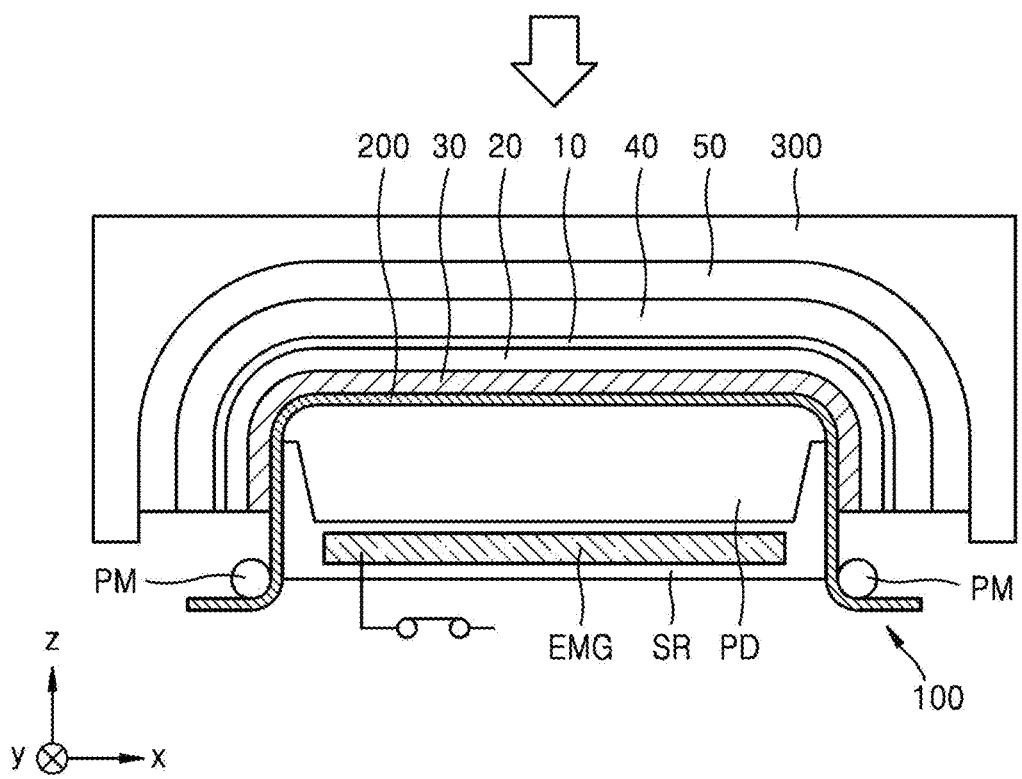

Referring to FIG. 13E, the cover window 50 may be prepared to be arranged at a jig 300. In an embodiment, the cover window 50 may be formed at the jig 300.

The cover window 50 may be disposed on the display substrate DS. After the display substrate DS is bent by applying a current to the electromagnet EMG, the cover window 50 may be disposed on the display substrate DS. The cover window 50 may be laminated on the display substrate DS. According to an embodiment, the cover window 50 may be laminated to the display substrate DS after the display substrate DS is previously bent by using the shape transformation device 100 including the electromagnet EMG. Accordingly, the reliability of a method of manufacturing a display device may increase.

Figure 14A:
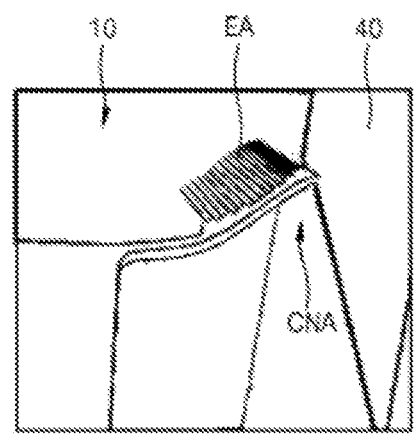
FIG. 14A is a diagram showing a display substrate bent without using an electromagnet as a comparative example.
Figure 14B:
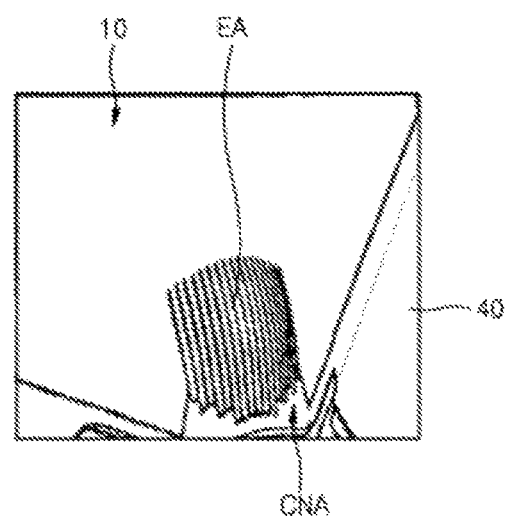
FIG. 14B is a diagram showing a display substrate bent by using an electromagnet, according to an embodiment.

FIG. 14A is a diagram showing a display substrate bent without using an electromagnet as a comparative example. FIG. 14B is a diagram showing a display substrate bent by using an electromagnet, according to an embodiment.

Referring to FIG. 14A, a display substrate may be bent without using an electromagnet. In the comparative example, a first adjacent area of the display panel 10 and a second adjacent area of the display panel 10 may be bent by the guide film 200, but the corner area CNA of the display panel 10 may not be bent. The corner area CNA of the display panel 10 may include the plurality of extension areas EA extending in a direction away from a flat area. When the corner area CNA is not bent by a shape transformation device, the corner area CNA of the display panel 10 may be damaged during a process of laminating the display substrate and a cover window. In the comparative example, for example, the plurality of extension areas EA may overlap each other during a process of laminating the display substrate and the cover window.

Referring to FIG. 14B, in an embodiment of the invention, a display substrate may be bent by using an electromagnet. In such an embodiment, the corner area CNA of the display panel 10 may be bent, and damage to the corner area CNA of the display panel 10 may be prevented or reduced during a process of laminating the display substrate and a cover window. In an embodiment, for example, a phenomenon in which the plurality of extension areas EA overlap each other during a process of laminating the display substrate and the cover window may be effectively prevented or substantially reduced.

Figure 15:
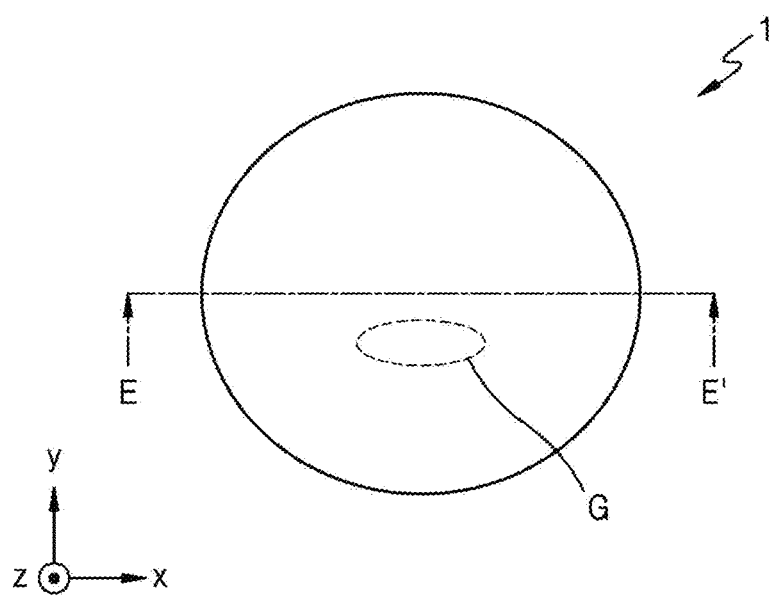
FIG. 15 is a schematic plan view of a display device according to an alternative embodiment.
Figure 16:
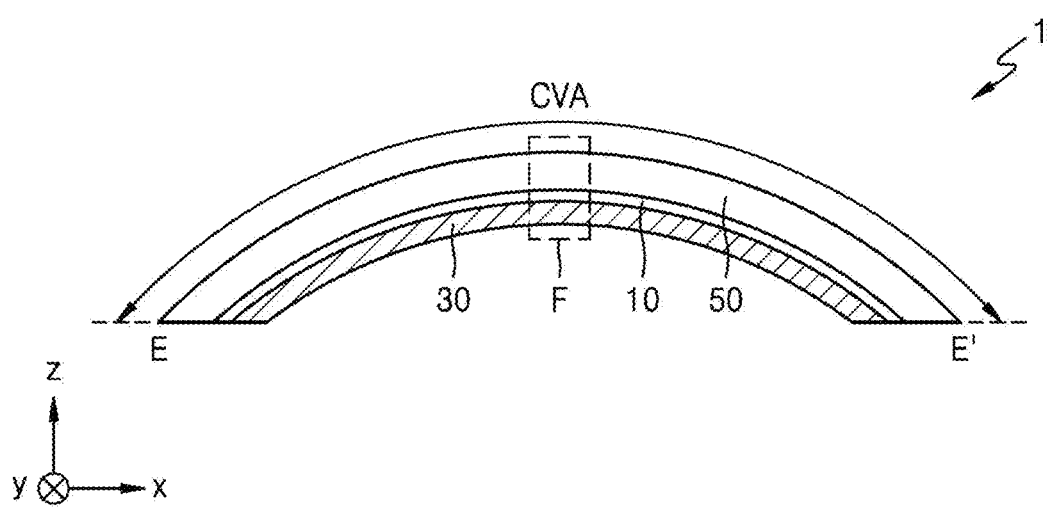
FIG. 16 is a schematic cross-sectional view of the display device of FIG. 15, taken along line E-E'.

FIG. 15 is a schematic plan view of the display device 1 according to an alternative embodiment. FIG. 16 is a schematic cross-sectional view of the display device 1 of FIG. 15, taken along line E-E'. In FIGS. 15 and 16, elements that are the same as those in FIG. 1A are designated by the same reference numerals, and any repetitive detailed description thereof will be omitted or simplified.

Referring to FIGS. 15 and 16, an embodiment of the display device 1 may include the display panel 10, the ferromagnetic layer 30, and the cover window 50. The display panel 10 may display an image. The display panel 10 may include the curved area CVA. The curved area CVA may be a bent area of the display panel 10. In an embodiment, the display panel 10 may include only the curved area CVA. In such an embodiment, the display panel 10 may have a bent shape overall. In an embodiment, for example, the display panel 10 may have a dome shape.

The ferromagnetic layer 30 may be disposed under the display panel 10. The ferromagnetic layer 30 may include a ferromagnetic material. In an embodiment, for example, the ferromagnetic material may include at least one selected from iron, nickel, and cobalt.

The cover window 50 may be disposed on the display panel 10. In an embodiment, the display panel 10 may be disposed between the ferromagnetic layer 30 and the cover window 50.

In some embodiments, an anti-magnetization layer may be disposed between the display panel 10 and the ferromagnetic layer 30.

Figure 17:
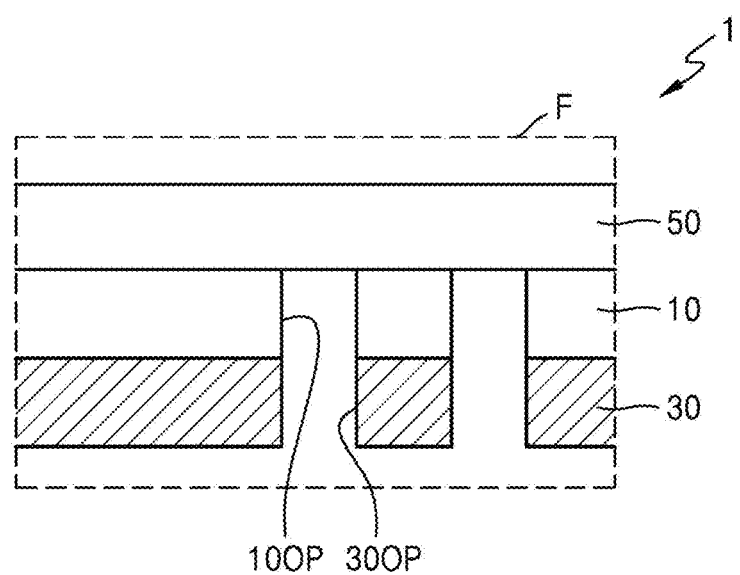
FIG. 17 is an enlarged view of region F of the display device of FIG. 16, according to an embodiment.

FIG. 17 is an enlarged view of region F of the display device 1 of FIG. 16, according to an embodiment. In FIG. 17, elements that are the same as those in FIG. 16 are designated by the same reference numerals, and any repetitive detailed description thereof will be omitted or simplified.

Referring to FIG. 17, an embodiment of the display device 1 may include the display panel 10, the ferromagnetic layer 30, and the cover window 50. The display panel 10 may include a plurality of panel openings 10OP, that is, the plurality of panel openings 10OP may be defined through the display panel 10. The plurality of panel openings 10OP may be apart from each other. Because the display panel 10 includes the plurality of panel openings 10OP, the display panel 10 may be flexible. In some embodiments, the display panel 10 includes the plurality of panel openings 10OP and thus may be stretchable.

The ferromagnetic layer 30 may include a plurality of ferromagnetic layer openings 30OP, that is, the plurality of ferromagnetic layer openings 30OP may be defined through the ferromagnetic layer 30. In an embodiment, a shape of a panel opening 100P and a shape of the ferromagnetic layer opening 30OP may be the same as each other. In such an embodiment, because the ferromagnetic layer 30 includes the plurality of ferromagnetic layer openings 30OP, the ferromagnetic layer 30 may be flexible. In addition, because the plurality of panel openings 10OP and the plurality of ferromagnetic layer openings 30OP respectively overlap each other, the display device 1 may be flexible.

Figure 18:
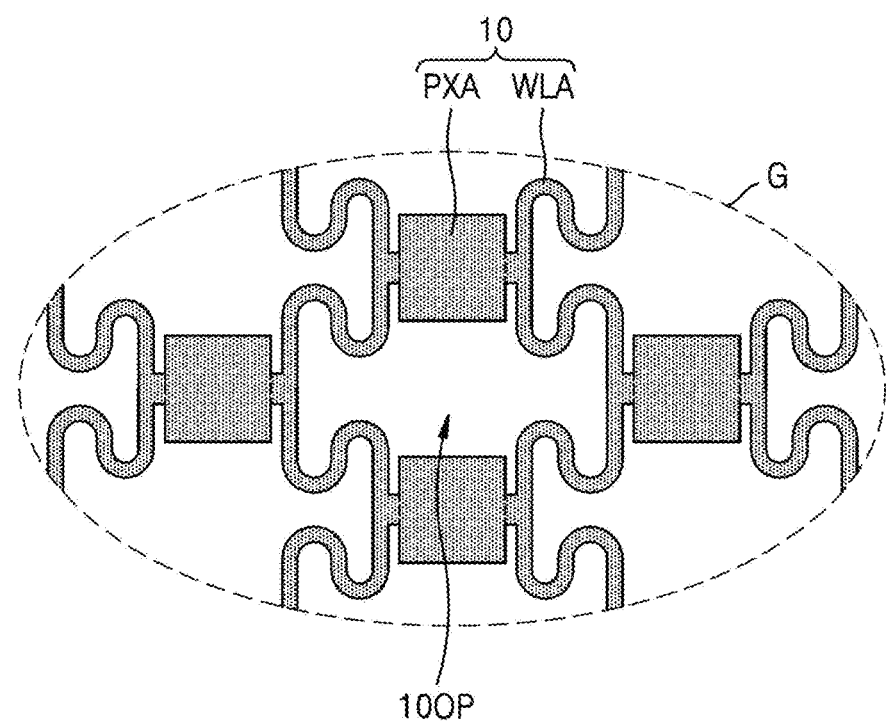
FIG. 18 is an enlarged view of region G of the display device of FIG. 15, according to an embodiment.

FIG. 18 is an enlarged view of region G of the display device 1 of FIG. 15, according to an embodiment. FIG. 18 schematically shows only the display panel 10 from among elements of the display device 1.

Referring to FIG. 18, an embodiment of the display panel 10 may include the panel opening 100P. In an embodiment, the display panel 10 may include the plurality of panel openings 10OP. The plurality of panel openings 10OP may be apart from each other. In such an embodiment, the display panel 10 may be flexible. In some embodiments, the display panel 10 includes the plurality of panel openings 10OP and thus may be stretchable.

The display panel 10 may include a pixel area PXA and a wiring area WLA. In an embodiment, the edge of the wiring area WLA and the edge of the pixel area PXA may define at least a portion of the panel opening 10OP.

A pixel may be arranged in the pixel area PXA. The pixel may include a red sub-pixel, a green sub-pixel, and a blue sub-pixel. Alternatively, the pixel may include a red sub-pixel, a green sub-pixel, a blue sub-pixel, and a white sub-pixel. The pixel area PXA may include a plurality of pixel areas PXA. The plurality of pixel areas PXA may be apart from each other. Although FIG. 18 shows an embodiment where the pixel area PXA has a quadrilateral shape, one or more embodiments are not limited thereto, and the pixel area PXA may have one of other various shapes such as a polygonal shape, a circular shape, an oval shape, etc.

A wiring configured to transmit an electrical signal and/or a power voltage to the pixel arranged in the pixel area PXA may be arranged in the wiring area WLA. The wiring area WLA may extend from the pixel area PXA. The wiring area WLA may extend between adjacent pixel areas PXA from among the plurality of pixel areas PXA. The wiring area WLA may be connected to the pixel area PXA. In the disclosure, it will be understood that, when the pixel area PXA and the wiring area WLA are referred to as being connected to each other, the pixel area PXA and the wiring area WLA are integrally provided or formed as a single unitary and indivisible part.

The wiring area WLA may include a plurality of wiring areas WLA, and each of the plurality of wiring areas WLA may extend between adjacent pixel areas PXA. In an embodiment, the wiring area WLA may extend in a serpentine manner. In an embodiment, for example, the wiring area WLA may extend in a curved shape.

In an embodiment, a ferromagnetic layer may be disposed under the display panel 10. The ferromagnetic layer may include a plurality of ferromagnetic layer openings. The plurality of ferromagnetic layer openings may be apart from each other. In an embodiment, the plurality of panel openings 10OP and the plurality of ferromagnetic layer openings may respectively overlap each other. In an embodiment, a shape of the panel opening 10OP and a shape of a ferromagnetic layer opening may be the same as each other.

Figure 19A:
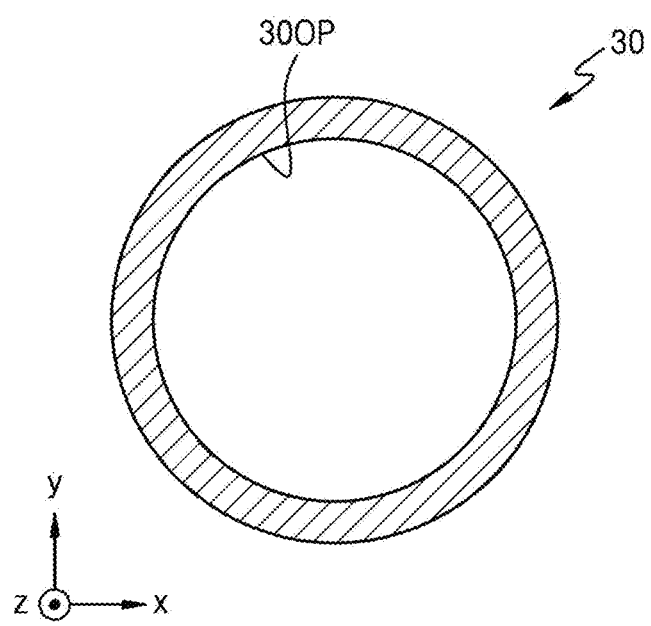
FIGS. 19A to 19C are each a schematic plan view of a ferromagnetic layer of a display device according to an embodiment.
Figure 19B:
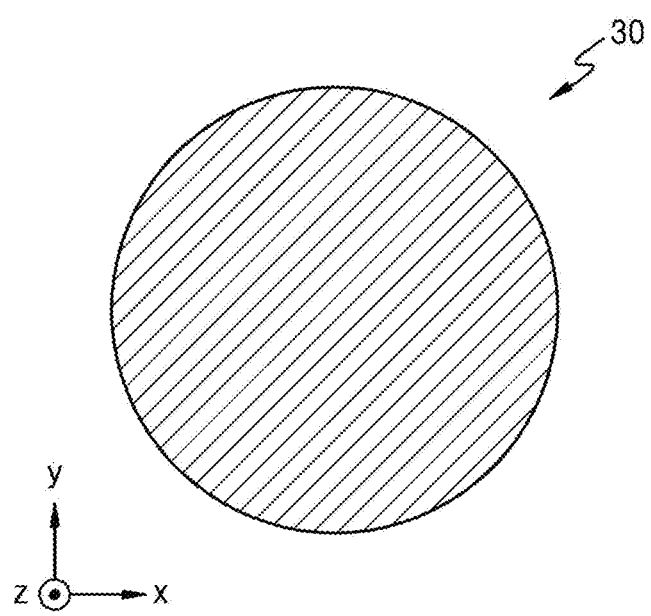
Figure 19C:
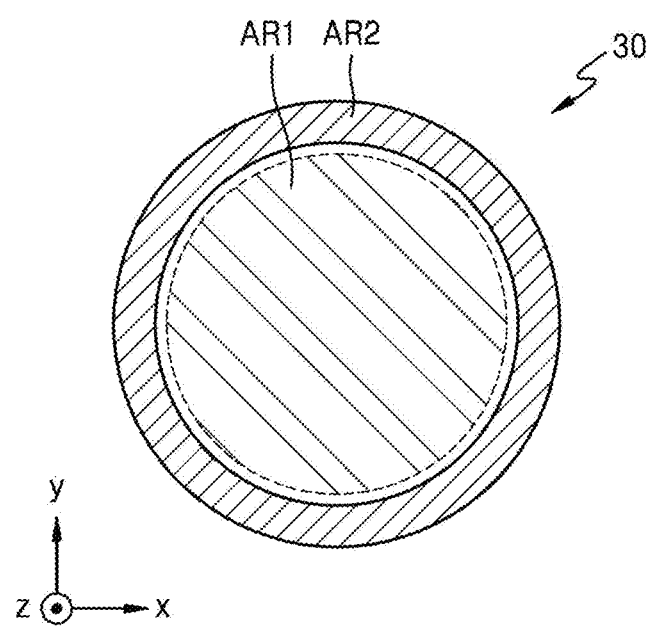

FIGS. 19A to 19C are each a schematic plan view of the ferromagnetic layer 30 of a display device according to an embodiment.

Referring to FIGS. 19A to 19C, the ferromagnetic layer 30 may include a ferromagnetic material. In an embodiment, for example, the ferromagnetic material may include at least one selected from iron, nickel, and cobalt.

Referring to FIG. 19A, the ferromagnetic layer 30 may include the ferromagnetic layer opening 30OP. In such an embodiment, the ferromagnetic layer 30 may be arranged at the edge of the display device and may not be arranged at a center of the display device. Accordingly, a display device may be flexible. Alternatively, the display device may be stretchable.

Referring to FIG. 19B, the ferromagnetic layer 30 may include an elastomer and a ferromagnetic material. The elastomer may be a polymer material having rubber elasticity. In an embodiment, the elastomer may include synthetic resin. In an embodiment, for example, the elastomer may include polyolefin, polyvinyl chloride, elastomeric silicone, elastomeric polyurethane, or elastomeric polyisoprene. In some embodiments, the elastomer may include polydimethylsiloxane (PDMS) and/or thermoplastic polyurethane (TPU). In such an embodiment, even when the ferromagnetic layer 30 is continuously arranged, a display device may be flexible. Alternatively, the display device may be stretchable.

Referring to FIG. 19C, the ferromagnetic layer 30 may include a first area AR1 and a second area AR2. The first area AR1 may include a conductive material. In an embodiment, the first area AR1 may include a material capable of blocking an external magnetic field. In some embodiments, the first area AR1 may include an elastomer. In some embodiments, the first area AR1 may include an elastomer and a ferromagnetic material. In an embodiment, for example, the ferromagnetic material may include at least one selected from iron, nickel, and cobalt.

The second area AR2 may at least partially surround the first area AR1. In an embodiment, the second area AR2 may entirely surround the first area AR1. The second area AR2 may include a ferromagnetic material. In an embodiment, for example, the ferromagnetic material may include at least one selected from iron, nickel, and cobalt.

The ferromagnetic layer 30 may be used to bend a display panel. A display panel may be bent during a process of manufacturing a display device. In the process of manufacturing the display device, the display panel may be disposed above a shape transformation device including an electromagnet, and when a current is applied to the electromagnet, the ferromagnetic layer 30 may receive an attractive force by the electromagnet.

The ferromagnetic layer 30 of FIG. 19C may shield a magnetic field by the electromagnet in the first area AR1 when a current is applied to the electromagnet. Accordingly, damage to the display panel due to the magnetic field may be effectively prevented or substantially reduced when the display device is manufactured. In addition, because the second area AR2 includes a ferromagnetic material, the second area AR2 may receive an attractive force by the electromagnet and thus may be bent. Accordingly, the display device may be bent into a previously set shape.

According to one or more of the embodiments described above, a display device may include a ferromagnetic layer including a ferromagnetic material and a display panel including a curved area that is bent. In such embodiments, the ferromagnetic layer is used to bend the display panel when the display device is manufactured, and thus, the display panel may include a curved area that is bent. Accordingly, the display device having various shapes may be provided.

According to one or more of the embodiments described above, a method of manufacturing a display device may include bending a display substrate including a ferromagnetic layer by applying a current to an electromagnet included in a shape transformation device. Accordingly, the display device having various shapes may be provided.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a ferromagnetic layer comprising a ferromagnetic material;
    a cover window disposed above the ferromagnetic layer; and
    a display panel disposed between the ferromagnetic layer and the cover window,
    wherein the display panel comprises a curved area which is bent, and a flat area, which is planar,
    wherein the ferromagnetic layer overlaps the curves area of the display panel, and
    wherein a ferromagnetic layer opening is defined through the ferromagnetic layer to overlap the flat area of the display panel.

2. The display device of claim 1, wherein the ferromagnetic material comprises at least one selected from iron, nickel, and cobalt.

3. The display device of claim 1, further comprising:
    an anti-magnetization layer disposed between the display panel and the ferromagnetic layer.

4. The display device of claim 1,
    wherein the display panel further comprises a flat area which is planar,
    wherein the curved area extends from the flat area,
    wherein the curved area comprises:
        a first adjacent area adjacent to the flat area in a first direction, a second adjacent area adjacent to the flat area in a second direction crossing the first direction, and a corner area at least partially surrounding the first adjacent area, the flat area, and the second adjacent area, wherein the first adjacent area, the second adjacent area, and the corner area are bent.

5. The display device of claim 4, wherein the corner area comprises a plurality of extension areas extending in a direction away from the flat area, wherein a space area is defined between adjacent extension areas from among the plurality of extension areas.

6. The display device of claim 1, wherein a plurality of panel openings is defined through the display panel to be apart from each other.

7. A display device comprising:

a ferromagnetic layer comprising a ferromagnetic material;

a cover window disposed above the ferromagnetic layer; and a display panel disposed between the ferromagnetic layer and the cover window, wherein the display panel comprises a curved area which is bent, wherein a plurality of panel openings is defined through the display panel to be apart from each other, wherein a plurality of ferromagnetic layer openings is defined through the ferromagnetic layer to be apart from each other, and wherein the plurality of panel openings and the plurality of ferromagnetic layer openings respectively overlap each other.

8. The display device of claim 1, wherein the ferromagnetic layer comprises:

a first area comprising a conductive material; and a second area at least partially surrounding the first area and comprising the ferromagnetic material.

9. The display device of claim 1, wherein the ferromagnetic layer comprises an elastomer.

* * * * *